(12) United States Patent
Nii

(10) Patent No.: US 7,969,766 B2
(45) Date of Patent: Jun. 28, 2011

(54) SEMICONDUCTOR MEMORY DEVICE

(75) Inventor: Koji Nii, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/772,905

(22) Filed: May 3, 2010

(65) Prior Publication Data

US 2010/0216284 A1 Aug. 26, 2010

Related U.S. Application Data

(60) Continuation of application No. 12/268,101, filed on Nov. 10, 2008, now Pat. No. 7,738,285, which is a continuation of application No. 11/987,180, filed on Nov. 28, 2007, now Pat. No. 7,489,539, which is a division of application No. 11/384,242, filed on Mar. 21, 2006, now Pat. No. 7,376,002, which is a continuation of application No. 11/207,938, filed on Aug. 22, 2005, now Pat. No. 7,035,135, which is a division of application No. 10/305,004, filed on Nov. 27, 2002, now Pat. No. 6,985,379.

(30) Foreign Application Priority Data

Apr. 1, 2002 (JP) .................................. 2002-098553

(51) Int. Cl.
*G11C 11/00* (2006.01)
(52) U.S. Cl. ............ 365/154; 365/63; 365/156; 257/390
(58) Field of Classification Search .................... 365/63, 365/154, 156, 230.05; 257/390–394, E27.098, 257/E27.099, E21.661; 438/128–129
See application file for complete search history.

(56) References Cited

U.S. PATENT DOCUMENTS

| | | | |
|---|---|---|---|
| 4,995,001 | A | 2/1991 | Dawson et al. |
| 5,774,393 | A | 6/1998 | Kuriyama |
| 5,808,933 | A | 9/1998 | Ross et al. |
| 5,966,317 | A | 10/1999 | O'Connor |
| 6,128,208 | A | 10/2000 | Itoh et al. |
| 6,240,009 | B1 | 5/2001 | Naffziger et al. |
| 6,347,062 | B2 | 2/2002 | Nii et al. |
| 6,469,328 | B2 | 10/2002 | Yanai et al. |
| 6,529,401 | B2 | 3/2003 | Nii |

(Continued)

FOREIGN PATENT DOCUMENTS

| | | |
|---|---|---|
| JP | 06-97393 | 4/1994 |
| JP | 10-178110 | 6/1998 |
| JP | 2000-30469 | 1/2000 |
| JP | 2000-133724 | 5/2000 |
| JP | 2001-28401 A | 1/2001 |
| JP | 2001-68635 | 3/2001 |
| JP | 2002-43441 | 2/2002 |

OTHER PUBLICATIONS

Japanese Office Action issued in Japanese Patent Application No. JP 2002-098553, mailed Sep. 16, 2008.

*Primary Examiner* — Gene N. Auduong
(74) *Attorney, Agent, or Firm* — McDermott Will & Emery LLP

(57) ABSTRACT

In a multiport SRAM memory cell of the present invention, an access transistor of a first port is disposed in a p-type well, and an access transistor of a second port is disposed in a p-type well. The gates of all of transistors disposed in a memory cell extend in the same direction. With the configuration, a semiconductor memory device having a low-power consumption type SRAM memory cell with an increased margin of variations in manufacturing, by which a bit line can be shortened in a multiport SRAM memory cell or an associative memory, can be obtained.

5 Claims, 25 Drawing Sheets

U.S. PATENT DOCUMENTS

| | | |
|---|---|---|
| 6,535,453 B2 | 3/2003 | Nii et al. |
| 6,693,820 B2 | 2/2004 | Nii et al. |
| 6,822,300 B2 | 11/2004 | Nii |
| 6,985,379 B2 | 1/2006 | Nii |
| 7,035,135 B2 | 4/2006 | Nii |
| 7,038,926 B2 | 5/2006 | Jeong et al. |
| 7,489,539 B2 | 2/2009 | Nii |
| 7,554,163 B2 | 6/2009 | Yamada et al. |
| 2001/0050380 A1 | 12/2001 | Yanai et al. |
| 2005/0083765 A1 | 4/2005 | Jeong et al. |

SEMICONDUCTOR MEMORY DEVICE

RELATED APPLICATIONS

This application is a Continuation of U.S. application Ser. No. 12/268,101, filed on Nov. 10, 2008, now U.S. Pat. No. 7,738,285 which is a Continuation of U.S. application Ser. No. 11/987,180, filed on Nov. 28, 2007, now U.S. Pat. No. 7,489,539, which is a Divisional of U.S. application Ser. No. 11/384,242, filed on Mar. 21, 2006, now U.S. Pat. No. 7,376,002, which is a Continuation of U.S. application Ser. No. 11/207,938, filed on Aug. 22, 2005, now U.S. Pat. No. 7,035,135, which is a Divisional of U.S. application Ser. No. 10/305,004, filed Nov. 27, 2002, now U.S. Pat. No. 6,985,379, claiming priority of Japanese Patent Application No. 2002-098553, filed on Apr. 1, 2002, the entire contents of each of which are hereby incorporated by reference.

BACKGROUND OF THE INVENTION

1. Field of the Invention

The present invention relates to a semiconductor memory device including an SRAM (Static Random Access Memory) having a CMOS (Complementary Metal Oxide Semiconductor) configuration, and more particularly relates to a layout structure of a memory cell directed to increase the processing speed of a multiport memory or an associative memory (CAM: Content Addressable Memory).

2. Description of the Background Art

In recent years, as electronic devices are becoming smaller and lighter, demand for realizing higher processing speed of the devices has been increased. In such an electronic device, it is indispensable to mount a microcomputer nowadays and to realize a higher-speed memory of a larger capacity in the configuration of the microcomputer. As a personal computer is being rapidly spread and the performance of the personal computer is increasing, to realize higher-speed processing, increase in the capacity of a cache memory is being demanded. Specifically, a RAM used by a CPU (Central Processing Unit) at the time of executing a control program and the like is requested to have a higher processing speed and a larger capacity.

As a RAM, generally, a DRAM (Dynamic RAM) and an SRAM are used. For a part requiring high-speed processing like the above-described cache memory, usually, an SRAM is used. As the configuration of an SRAM memory cell, a high-resistive load type configuration of four transistors and two high-resistive elements, and a CMOS type configuration of six transistors are known. Particularly, a CMOS type SRAM is considerably reliable since a leak current at the time of retaining data is very small, so that it is in the mainstream at present.

FIG. 23 is a diagram showing an equivalent circuit of an SRAM memory cell having a general 6 transistor configuration. Referring to FIG. 23, a memory cell has two driver transistors N101 and N102, two access transistors N103 and N104, and two load transistors P101 and P102. Each of the two driver transistors N101 and N102 and two access transistors N103 and N104 takes the form of an nMOS transistor, and each of two load transistors P101 and P102 takes the form of a pMOS transistor.

A first inverter is formed of nMOS transistor N101 and pMOS transistor P101, and a second inverter is formed of nMOS transistor N102 and a PMOS transistor P102. An output terminal of each of the first and second inverters is connected to an input terminal of the other inverter, thereby forming storage nodes "a" and "b".

The source, gate, and drain of nMOS transistor N103 are connected to storage terminal "a", a word line WL, and a bit line BL, respectively. The source, gate, and drain of nMOS transistor N104 are connected to the other storage terminal "b", word line WL, and the other bit line /BL, respectively.

The source of each of driver transistors N101 and N102 is connected to the GND potential, and the source of each of load transistors P101 and P102 is connected to the VDD potential.

The layout in plan view of such an SRAM memory cell is, for example, as shown in FIG. 24.

FIG. 24 is a schematic plan view showing the layout of, mainly, a transistor part of an SRAM memory cell having a conventional 6 transistors configuration. Referring to FIG. 24, the memory cell is formed in the surface of an n-type well and a p-type well formed in the surface of a semiconductor substrate. Two nMOS transistors N101 and N102 as a pair of driver transistors and two nMOS transistors N103 and N104 as a pair of access transistors are formed in a p-type well. Two pMOS transistors P101 and P102 as a pair of load transistors are formed in an n-type well.

Each of two nMOS transistors N101 and N102 has a source and a drain formed in a pair of n-type diffusion regions 105$a$, and a gate 106$b$. Each of two nMOS transistors N103 and N104 has a source and a drain formed in a pair of n-type diffusion regions 105$a$, and a gate 106$a$. Each of two pMOS transistors P101 and P102 has a source and a drain formed in a pair of p-type diffusion regions 105$b$, and gate 106$b$.

The six transistors are connected as shown in FIG. 23. Word line WL (not shown) is connected to gate 106$a$ and extends across the memory cell in the direction X in the figure. Bit lines BL and /BL (not shown) as a pair are connected to drains 105$a$ of access transistors N103 and N104 and extend across the memory cell in the direction Y in the figure.

The layout of the SRAM memory cell having the conventional 6 transistors configuration is as described above.

In the layout of the SRAM memory cell having the conventional 6 transistors configuration shown in FIG. 24, since the orientation of access transistors N103 and N104 and that of driver transistors N101 and N102 are different from each other, the dimension in the bit line direction (direction Y) of the memory cell layout is long, and the bit line is therefore long. Accordingly, the line capacity of the bit line is large, the capacity between the bit lines is large, and it causes a problem of long access time.

Since the orientation of access transistors N103 and N104 and that of driver transistors N101 and N102 are different from each other, optimization to finish the memory cell into desired dimensions is difficult. There is a problem such that it is difficult to assure a margin for variations in manufacturing such as a deviation of a mask.

To deal with the problems, the configuration in which the dimension in the bit line direction of the memory cell layout is shortened in an SRAM memory having the 6 transistors configuration is proposed in, for example, Japanese Patent Laying-Open Nos. 10-178110 and 2001-28401. The layout of an SRAM memory cell having the 6 transistors configuration disclosed in Japanese Patent Laying-Open No. 10-178110 will be described hereinafter.

FIGS. 25 and 26 are schematic plan views each showing the layout of the SRAM memory cell having the 6 transistors configuration disclosed in the publication. Referring to FIG. 25, a memory cell is formed in the surface of an n-type well formed in the surface of a semiconductor substrate and in the surface of p-wells formed on both sides of the n-type well.

Two pMOS transistors P101 and P102 as a pair of load transistors are formed in the n-type well in the center. nMOS transistor N101 as a driver transistor and nMOS transistor N103 as an access transistor are formed in the p-type well in the left part of the figure. nMOS transistor N102 as a driver transistor and nMOS transistor N104 as an access transistor are formed in the p-type well in the right part of the figure.

Referring to FIG. 26, bit lines BL and /BL are formed separately as second metal wiring layers. Each of bit lines BL and /BL is connected to one of semiconductor terminals of access transistors N103 and N104 in the lower layer. A power supply line VDD is formed in parallel with the bit lines as the second metal wiring layer and connected to one of semiconductor terminals of load transistors P101 and P102 in the lower layer. Two ground lines GND are formed as the second metal wiring layer in parallel on both sides of word line WL. Further, word line WL is formed as a third metal wiring layer in the direction orthogonal to bit lines BL and /BL and is connected to the gate of each of access transistors N103 and N104 in the lower layer.

However, also with the layout disclosed in the publications, a concrete solving method is not found for a multiport SRAM memory and an associative memory.

SUMMARY OF THE INVENTION

An object of the present invention is to provide a semiconductor memory device having an SRAM memory cell of a low power consumption type by which a bit line length can be shortened in a multiport SRAM memory cell or an associative memory and a margin of variations which occur in manufacturing is increased.

According to one aspect of the present invention, a semiconductor memory device having a memory cell region in which a statistic memory cell is formed, includes first and second inverters, and first and second access transistors. The first inverter is formed of a first driver transistor of a first conductive type and a first load transistor of a second conductive type. The second inverter is formed of a second driver transistor of the first conductive type and a second load transistor of the second conductive type. An output terminal of the first inverter and an input terminal of the second inverter are electrically connected to each other, thereby forming a first storage node. An output terminal of the second inverter and an input terminal of the first inverter are electrically connected to each other, thereby forming a second storage node. A first access transistor of the first conductive type has a source electrically connected to the first storage node, a gate electrically connected to a word line for writing, and a drain electrically connected to a bit line for writing. A second access transistor of the first conductive type has a gate electrically connected to a word line for reading, and a drain electrically connected to a bit line for reading. The first access transistor is disposed on one side of a region in which the first and second load transistors are formed, the second access transistor is disposed on the other side of the region in which the first and second load transistors are formed. Gates of all of the transistors are disposed in the memory cell region extend in the same direction.

In the semiconductor memory device according to one aspect of the present invention, since the gates of all of the transistors disposed in the memory cell region extend in the same direction, if the direction orthogonal to the gate extending direction is set as the direction in which the bit lines extend, the dimension in the bit line direction of the memory cell can be shortened. Thus, the wiring capacity of bit lines and capacity between the bit lines can be reduced, and the access time can be shortened.

Since the gates of all of the transistors disposed in the memory cell region extend in the same direction, optimization to finish the memory cell in a desired dimension is facilitated, and a margin of variations in manufacturing can be increased.

Further, the first and second access transistors are disposed on the opposite sides of the region in which the first and second load transistors are formed. Thus, the bit line for writing and the bit line for reading can be routed separately. Therefore, interference between ports can be suppressed.

According to another aspect of the present invention, a semiconductor memory device having a memory cell region in which a statistic memory cell is formed, includes first and second inverters, first and second access transistors, and first, second and third transistors. The first inverter is formed of a first driver transistor of a first conductive type and a first load transistor of a second conductive type. The second inverter is formed of a second driver transistor of the first conductive type and a second load transistor of the second conductive type. An output terminal of the first inverter and an input terminal of the second inverter are electrically connected to each other, thereby forming a first storage node. An output terminal of the second inverter and an input terminal of the first inverter are electrically connected to each other, thereby forming a second storage node. Sources of first and second access transistors of the first conductive type are electrically connected to the first and second storage nodes, respectively, and drains are electrically connected to a pair of bit lines. The first transistor of the first conductive type has a gate electrically connected to the first storage node and a source electrically connected to one of search lines as a pair. The second transistor of the first conductive type has a gate electrically connected to the second storage node, a source electrically connected to the other search line of the pair of search lines, and a drain electrically connected to the drain of the first transistor. The third transistor of the first conductive type has a gate electrically connected to the drains of the first and second transistors and a drain electrically connected to a match line. The first and second access transistors and the first driver transistor are disposed on one side of a region in which the first and second load transistors are formed, and the second driver transistor and the first, second and third transistors are disposed on the other side of the region in which the first and second load transistors are formed. Gates of all of transistors disposed in the memory cell region extend in the same direction.

In the semiconductor memory device according to another aspect of the present invention, since the gates of all of the transistors disposed in the memory cell region extend in the same direction, if the direction orthogonal to the gate extending direction is set as the direction in which the bit lines extend, the dimension in the bit line direction of the memory cell can be shortened. Thus, the wiring capacity of bit lines and capacity between the bit lines can be reduced, and the access time can be shortened. Since the gates of all of the transistors disposed in the memory cell region extend in the same direction, optimization to finish the memory cell in a desired dimension is facilitated, and a margin of variations in manufacturing can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
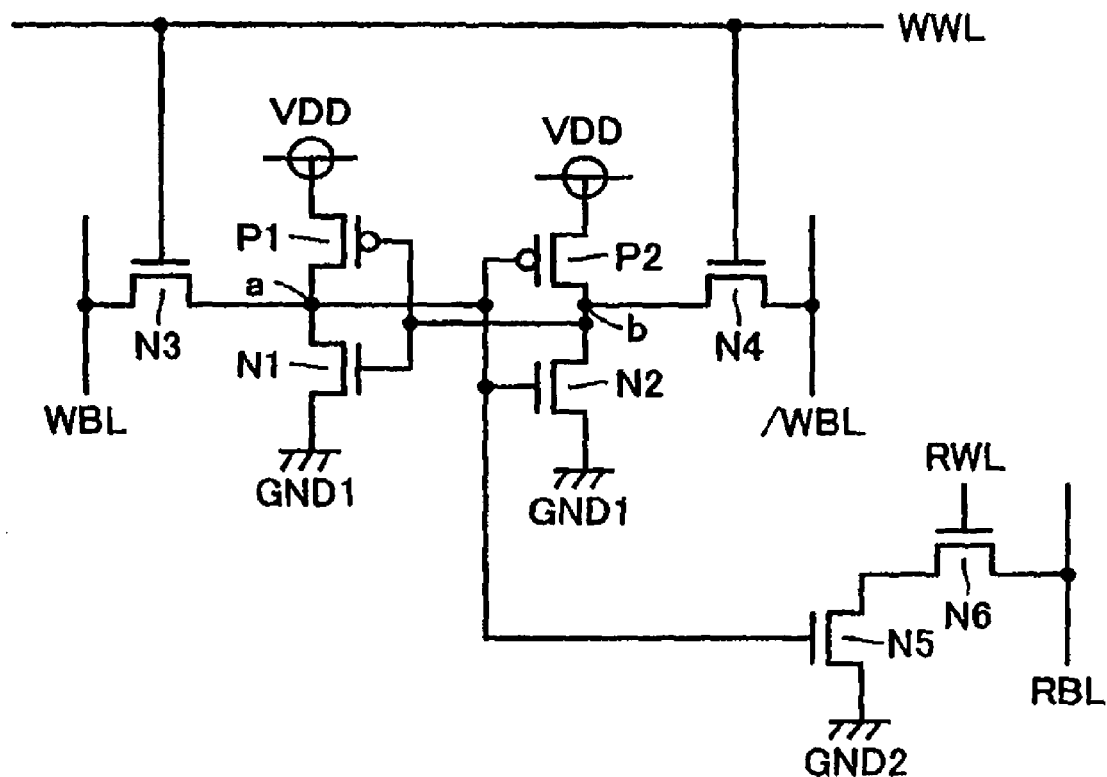
FIG. 1 is a diagram showing an equivalent circuit of a memory cell in an SRAM in a first embodiment of the present invention.

Referring to FIG. 1, a memory cell has two driver transistors N1 and N2, two access transistors N3 and N4, two load transistors P1 and P2, and nMOS transistors N5 and N6 which form of a port for reading.

Two driver transistors N1 and N2, two access transistors N3 and N4, and transistors N5 and N6 are formed of nMOS transistors, and two load transistors P1 and P2 are formed of pMOS transistors.

A first inverter is formed of nMOS transistor N1 and pMOS transistor P1, and a second inverter is formed of nMOS transistor N2 and pMOS transistor P2. The output terminal of each of the first and second inverters is connected to the input terminal of the other inverter, thereby forming storage nodes "a" and "b".

The source, gate, and drain of nMOS transistor N3 are connected to storage terminal "a", a word line WWL for writing, and a bit line WBL for writing, respectively. The source, gate, and drain of nMOS transistor N4 are connected to the other storage terminal "b", word line WL for writing, and the other bit line /WBL for writing, respectively.

The source of each of driver transistors N1 and N2 is connected to the GND potential, and the source of each of load transistors P1 and P2 is connected to the VDD potential.

A first port is formed of nMOS transistors N3 and N4, write word line WWL, and the pair of write bit lines WBL and /WBL. Since the first port is formed of the two access transistors, stable writing and reading operations in a differential manner can be performed.

A second port is formed of nMOS transistors N5 and N6, a bit line RBL for reading, and a word line RWL for reading. The drain of nMOS transistor N5 and the source of nMOS transistor N6 are commonly connected to each other. The source and gate of nMOS transistor N5 are connected to a ground line GND2 and storage node "b", respectively. The drain and gate of nMOS transistor N6 are connected to read bit line RBL and read word line RWL, respectively.

By connecting the elements as described above, a two-ports SRAM memory cell circuit having a port dedicated to reading is formed.

An example of a circuit operation using the equivalent circuit diagram of FIG. 1 will now be described.

First, a case of reading stored data in the first port will be described. Initially, word line WWL is at the "L" level, access transistor N3 is off, and a data is in a held state. When a reading operation is started, word line WWL rises to "H" level, and access transistor N3 is turned on, so that storage node "a" and bit line WBL are electrically connected to each other. Assuming that storage node "a" holds the "H" level, the "H" level is read onto bit line WBL. On the contrary, if storage node "a" holds the "L" level, the "L" level is read onto bit line WBL. After that, word line WWL returns to "L" level again, access transistor N3 is turned off, and the data is held again.

A writing operation in the first port will now be described. In the case of writing the "H" level to storage node "a", bit line WBL is driven to the "H" level by a driver circuit (not shown). In the case of writing the "L" level, bit line WBL is driven to the "L" level by the driver circuit. When word line WWL is changed from the "L" level to the "H" level, access transistor N3 changes from the OFF state to the ON state, and bit line WBL and storage node "a" are electrically connected to each other. Since bit line WBL is strongly driven, irrespective of the stored data, storage node "a" changes to the level of bit line WBL. For example, when bit line WBL is driven to the "L" level, storage node "a" falls to "L" level and storage node "b" on the opposite side rises to "H" level. On the contrary, when bit line WBL is driven to the "H" level, storage node "a" rises to "H" level and storage node "b" on the opposite side falls to "L" level. After that, when write word line WWL changes from the "H" level to the "L" level and access transistor N3 is turned off, storage nodes "a" and "b" are stabilized at the data writing level, and the data is held, thereby completing the writing operation.

The reading operation in the second port will now be described.

In a not-reading state, read bit line RBL is precharged to the "H" level. Read word line RWL is at the "L" level, that is, nMOS transistor N6 is in an OFF state. Hit is assumed that storage node "a" is at the H level, nMOS transistor N5 is in an ON state.

When the reading operation is started and read word line RWL changes from the "L" level to the "H" level, nMOS transistor N6 changes from the OFF state to the ON state. Read bit line RBL and ground line GND2 are electrically made conductive via nMOS transistors N5 and N6, so that read bit line RBL changes from the "H" level as a precharge level to the "L" level, and the "L" level as inversion data of storage node "a" is read out. After that, when word line RWL changes again to the "L" level from the "H" level, nMOS transistor N6 is turned off, and read bit line RBL and ground line GND2 are electrically disconnected from each other. For the next reading operation, read bit line RBL is precharged again to the "H" level, thereby completing the reading operation.

On the other hand, if storage node "a" is at the "L" level, nMOS transistor N5 is in the OFF state. When the reading operation is started and read word line RWL changes from the "L" level to the "H" level, nMOS transistor N6 changes from the OFF state to the ON state. However, nMOS transistor N5 remains in the OFF state, so that read bit line RBL remains at the "H" level as a precharge level and does not change. Consequently, the "H" level as inversion data of storage node "a" is read. After that, word line RWL changes back to "L" level from the "H" level, thereby completing the reading operation.

As described above, the writing operation cannot be performed in the second port and only the reading operation is performed.

The layout in plan view of the two-port SRAM memory cell will now be described.

Figure 2:
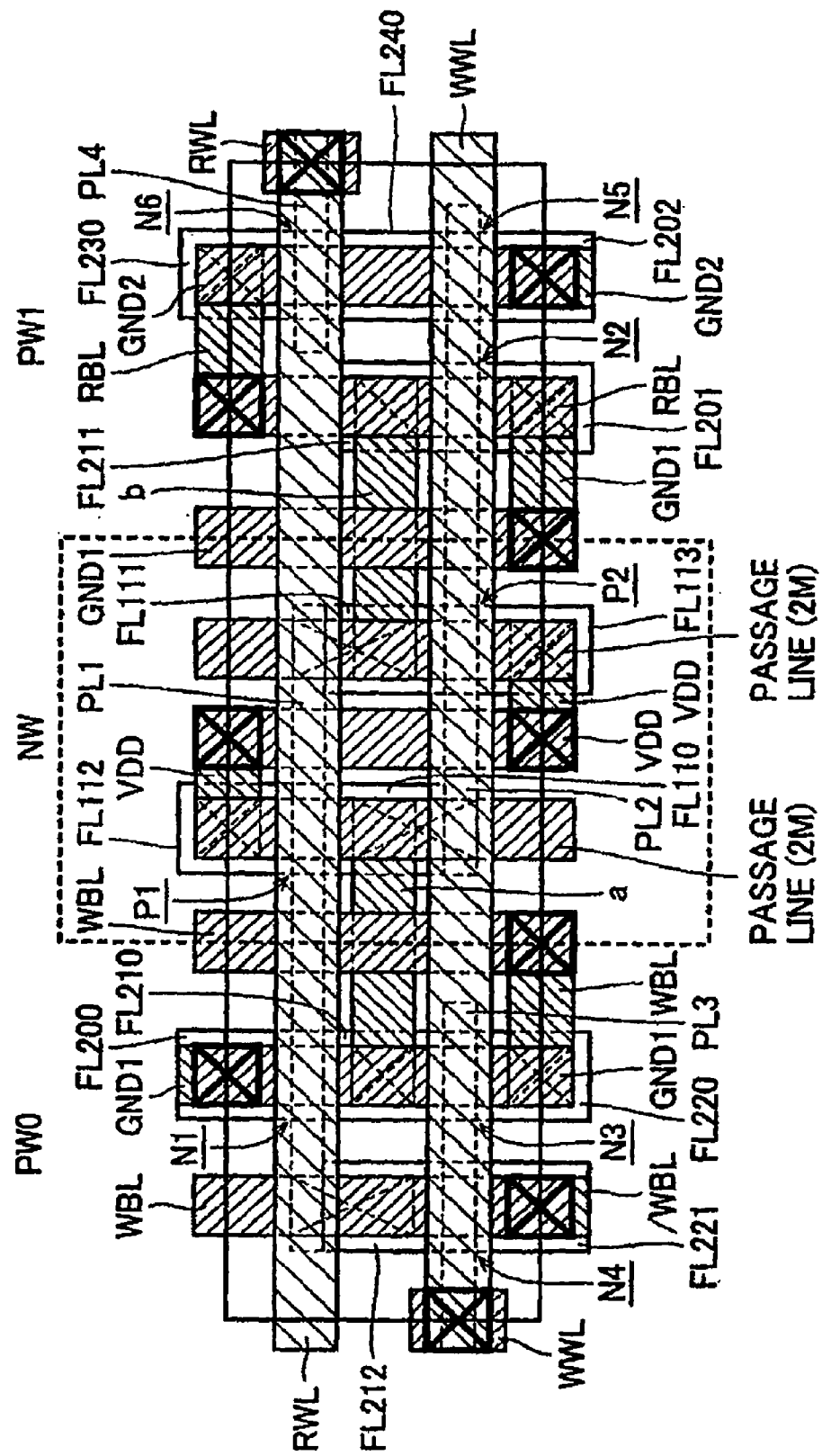
FIG. 2 is a schematic plan view showing the layout of a memory cell of an SRAM in the first embodiment of the present invention.
Figure 3:
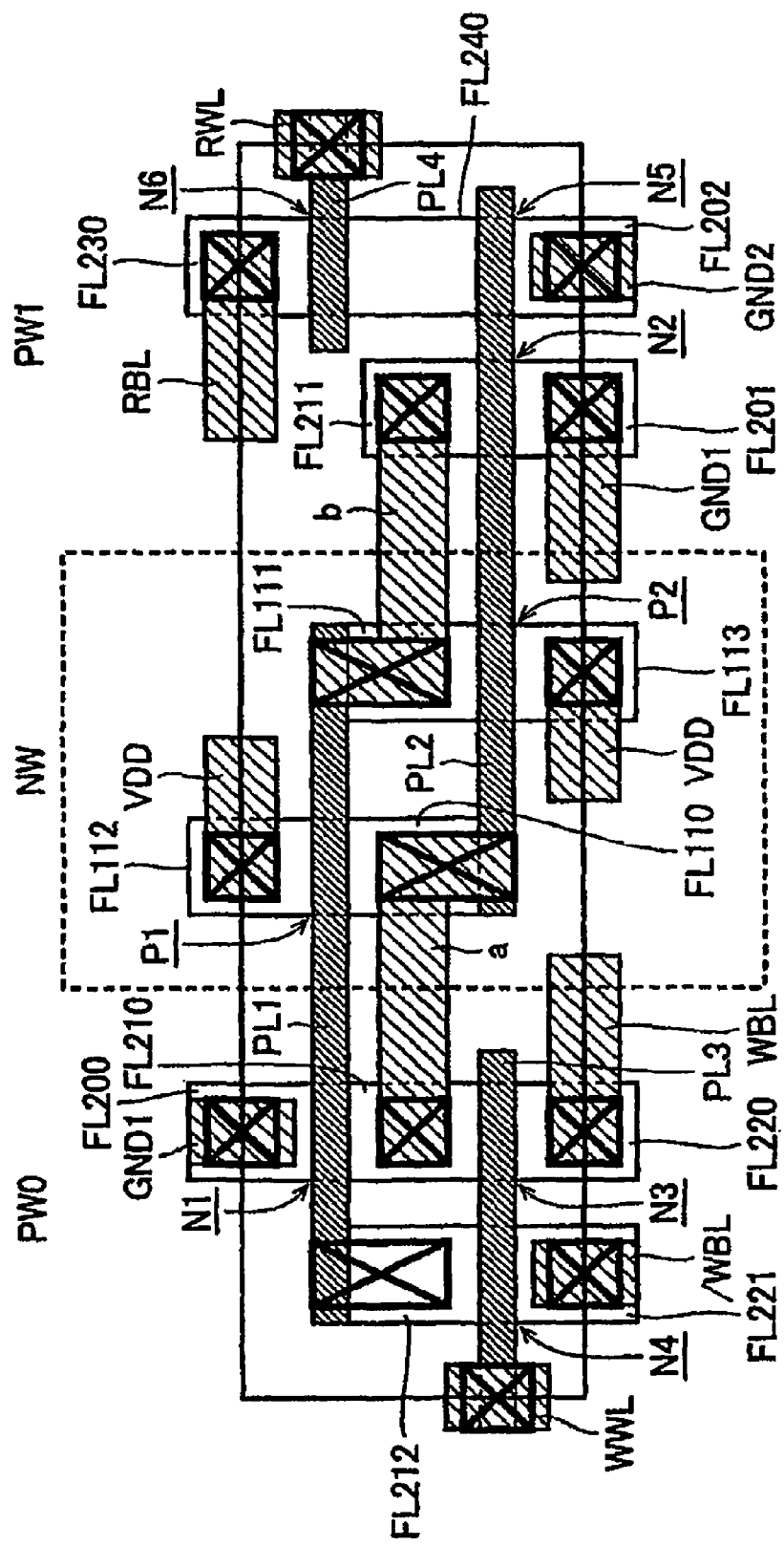
FIG. 3 is a schematic plan view showing a layout of the low layer side in the stacking direction of the layout of FIG. 2.
Figure 4:
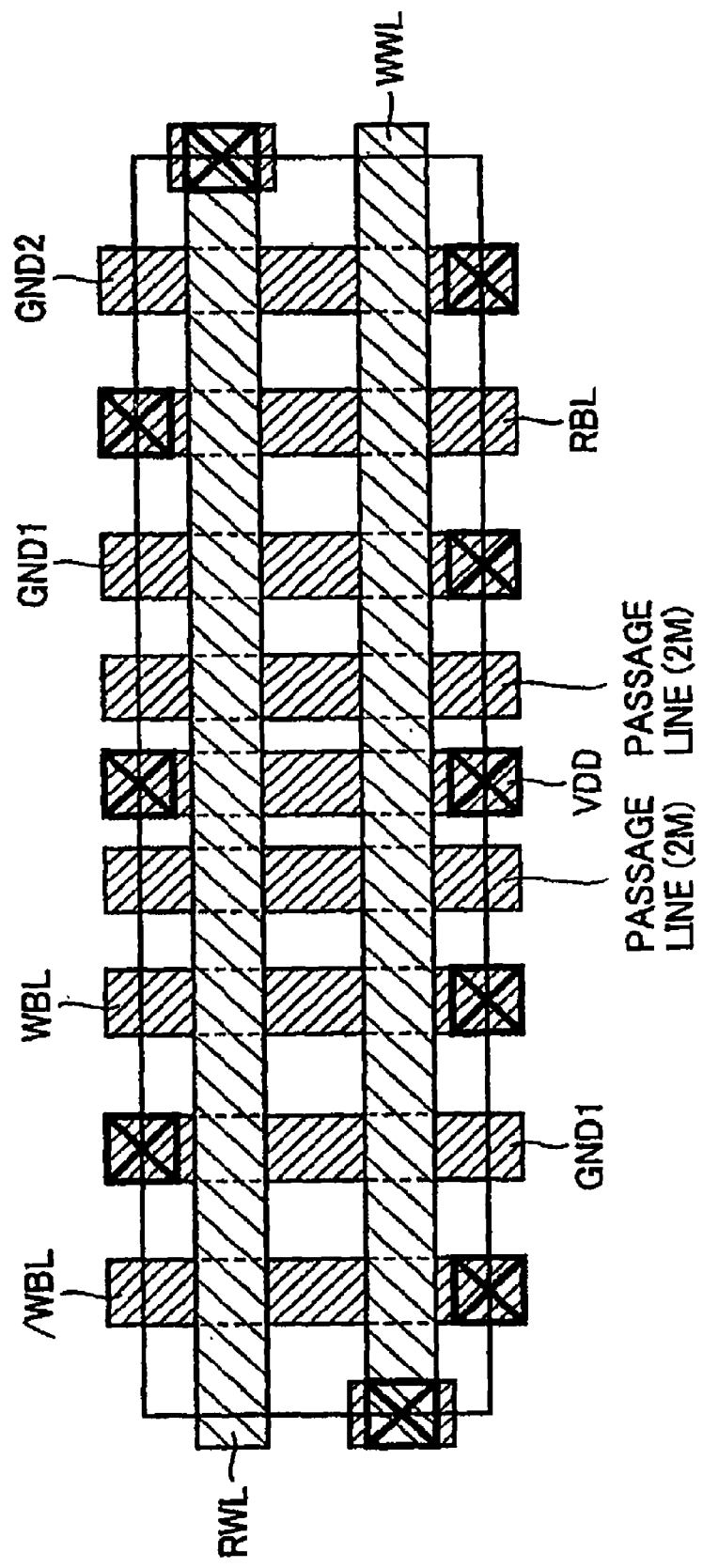
FIG. 4 is a schematic plan view showing a layout of the upper layer side in the stacking direction of the layout of FIG. 2.

Referring to FIGS. 2 to 4, in the surface of a semiconductor substrate, one n-type well region NW and two p-type well regions PW0 and Pw1 sandwiching n-type well region NW are formed. pMOS transistors P1 and P2 are formed in n-type well NW. nMOS transistors N1, N3, and N4 are formed in p-type well PW0, and nMOS transistors N2, N5, and N6 are formed in p-type well PW1.

Referring mainly to FIG. 3, pMOS transistor P1 has a source and a drain formed by a pair of p-type diffusion regions FL112 and FL110, and a gate PL1. pMOS transistor P2 has a source and a drain formed by a pair of p-type diffusion regions FL113 and FL111, and a gate PL2.

nMOS transistor N1 has a source and a drain formed by a pair of n-type diffusion regions FL200 and FL210, and a gate PL1. nMOS transistor N2 has a source and a drain formed by a pair of n-type diffusion regions FL201 and FL211, and gate PL2.

nMOS transistor N3 has a source and a drain formed by a pair of n-type diffusion regions FL210 and FL220, and a gate PL3. nMOS transistor N4 has a source and a drain formed by a pair of n-type diffusion regions FL212 and FL221, and a gate PL3.

nMOS transistor N5 has a source and a drain formed by a pair of n-type diffusion regions FL202 and FL240, and gate PL2. nMOS transistor N6 has a source and a drain formed by a pair of n-type diffusion regions FL240 and FL230, and a gate PL4.

Each of the n-type diffusion regions is formed by doping active regions in p-type wells PW0 and PW1 with an n-type impurity. Each of the p-type diffusion regions is formed by doping active regions in n-type well NW with a p-type impurity.

n-type diffusion region FL210 in nMOS transistor N1 and n-type diffusion region FL210 in nMOS transistor N3 are a common diffusion region. n-type diffusion region FL240 in nMOS transistor N5 and n-type diffusion region FL240 in nMOS transistor N6 are a common diffusion region.

Gate PL1 in pMOS transistor P1 and gate PL1 in nMOS transistor N1 are formed of a common doped polycrystalline silicon (polycrystalline silicon doped with an impurity) interconnection. Gate PL2 in pMOS transistor P2 and gates PL2 in nMOS transistors N2 and N5 are formed of a common doped polycrystalline silicon interconnection. Gates PL3 in nMOS transistors N3 and N4 are formed of a common doped polycrystalline silicon interconnection.

Gate PL2, p-type diffusion region FL110, and n-type diffusion region FL210 are electrically connected to each other via a contact hole at low impedance by a first metal interconnection corresponding to storage terminal "a". Gate PL1 is also electrically connected to n-type diffusion region FL212. Gate PL1, p-type diffusion region FL111, and n-type diffusion region FL211 are electrically connected to each other via a contact hole at low impedance by the first metal interconnection corresponding to storage terminal "b".

Referring mainly to FIGS. 3 and 4, different first metal interconnections are electrically connected to p-type diffusion regions FL112 and FL113 via a contact hole. The different first metal interconnections are electrically connected to the second metal interconnection which is at the VDD potential via a first via hole.

A first metal interconnection is electrically connected to n-type diffusion region FL220 via a contact hole, and is electrically connected to the second metal interconnection serving as write word line WBL of the first port via the first via hole. n-type diffusion region FL221 is electrically connected to the first metal interconnection via a contact hole. The first metal interconnection is electrically connected via the first via hole to a second metal interconnection serving as write bit line /WBL of the first port. The first metal interconnection is electrically connected to n-type diffusion region FL200 via a contact hole, and a second metal interconnection serving as ground line GND1 is electrically connected to the first metal interconnection via the first via hole.

A first metal interconnection is electrically connected to n-type diffusion region FL230 via a contact hole. A second metal interconnection serving as read bit line RBL of the second port is electrically connected to the first metal interconnection via the first via hole. The first metal interconnection is electrically connected to n-type diffusion region FL201 via a contact hole, and a second metal interconnection serving as ground line GND1 is electrically connected through the first via hole to the first metal interconnection. A first metal interconnection is electrically connected to n-type diffusion region FL202 via a contact hole, and a second metal interconnection serving as ground line GND2 is electrically connected to the first metal interconnection via a first via hole.

All the second metal interconnections routed in the memory cell region are disposed in parallel with each other and extend in the direction parallel to a boundary line between n-type well NW and p-type well PW0 and a boundary line between n-type well NW and p-type well PW1. In addition, a passage line made by the second metal interconnection may be disposed, for example, on both sides of a second metal interconnection, for example, at the VDD potential so as to be parallel to the second metal interconnections. The passage line just passes through the memory cell but is not electrically conducted with any of elements in the memory cell (nonconductive state). The position of the passage line is not limited to both sides of the interconnection at the VDD potential but the passage line can be disposed in accordance with a design.

A first metal interconnection is electrically connected to gate PL3 via a contact hole, and a third metal interconnection serving as write word line WWL of the first port is electrically connected to the first metal interconnection via a second via hole. A first metal interconnection is electrically connected to gate PL4 via a contact hole, and a third metal interconnection serving as read word line RWL of the second port is electrically connected to the first metal interconnection through the second via hole.

All of the third metal interconnections disposed in the memory cell region are also disposed parallel to each other and extend in the direction orthogonal to the boundary line between n-type well NW and p-type well PW0 and the boundary line between n-type well NW and p-type well PW1. According to the embodiment, with the layout of the two-port memory cell as described above, the length of the bit lines can be shortened as compared with a conventional cell, so that the access time can be shortened. Moreover, the orientations of the doped polycrystalline silicon interconnections become the same, so that control on the gate dimension is facilitated.

nMOS transistors N1, N3 and N4 are disposed on one side of the region in which pMOS transistors P1 and P2 are formed (n-type well NW), and nMOS transistors N2, N5 and N6 are disposed on the other side of the region in which pMOS transistors P1 and P2 are formed (n-type well NW). Consequently, bit line WBL of the first port and bit line RBL of the second port can be routed apart from each other in different p-type wells. This configuration has an advantage that interference between the ports does not easily occur.

For example, when bit line WBL of the first port and bit line RBL of the second port are disposed adjacent to each other, an influence of noise caused by coupling capacity is easily exerted. On the other hand, if the potential of one of the bit lines fluctuates from the VDD potential to the GND potential during a writing operation, crosstalk noise due to the coupling capacity occurs in the other neighboring bit line. A reading operation is performed by amplifying a very small potential difference between the pair of bit lines by a sense amplifier. If the bit line of the first port is in the writing operation and the bit line of the second port adjacent to the first port is in the reading operation, there is the possibility that crosstalk noise occurs in the second bit line and data is erroneously read.

In contrast, in the embodiment, the bit lines of the first and second ports are not adjacent to each other as shown in FIG. 2, the problem of interference between the ports caused by the crosstalk noise can be avoided.

Since there is an allowance in the interval between bit lines, ground line GND 1 of the inverter circuit as a component of a storage circuit and ground line GND2 for the port for reading can be separately routed. In such a manner, noise occurring on ground line GND2 in the reading operation can be prevented from exerting an influence on the storage circuit. Moreover, noise which occurs on ground line GND1 in the reading/writing operation can be also prevented from exerting an influence on the read circuit. The ground potential of ground line GND1 and that of ground line GND2 can be separately set by an external circuit or an external terminal, so that various methods for reduction in leakage, increase in processing speed, and the like can be employed. For example, by setting the potential of ground line GND2 to be higher than that of ground line GND1 in a non-reading operation to reduce the potential difference between read bit line RBL and ground line GND2, an OFF leak current of nMOS transistors N5 and N6 in a standby mode can be lowered. Thus, lower power consumption can be achieved.

Since the layout shape of a memory cell is elongated in the lateral direction in the diagram, the passage line can be provided in the memory cell by using the same wiring layer as that for the bit lines. The passage line may be a global bit line or global data line provided when the memory cell is divided into hierarchical blocks, or an interconnection between blocks different from SRAM blocks. As it is unnecessary to purposely increase the size of a memory cell and to increase the number of wiring layers in order to provide the passage interconnection in the SRAM block, the configuration has an advantage of lower cost.

Second Embodiment

Figure 5:
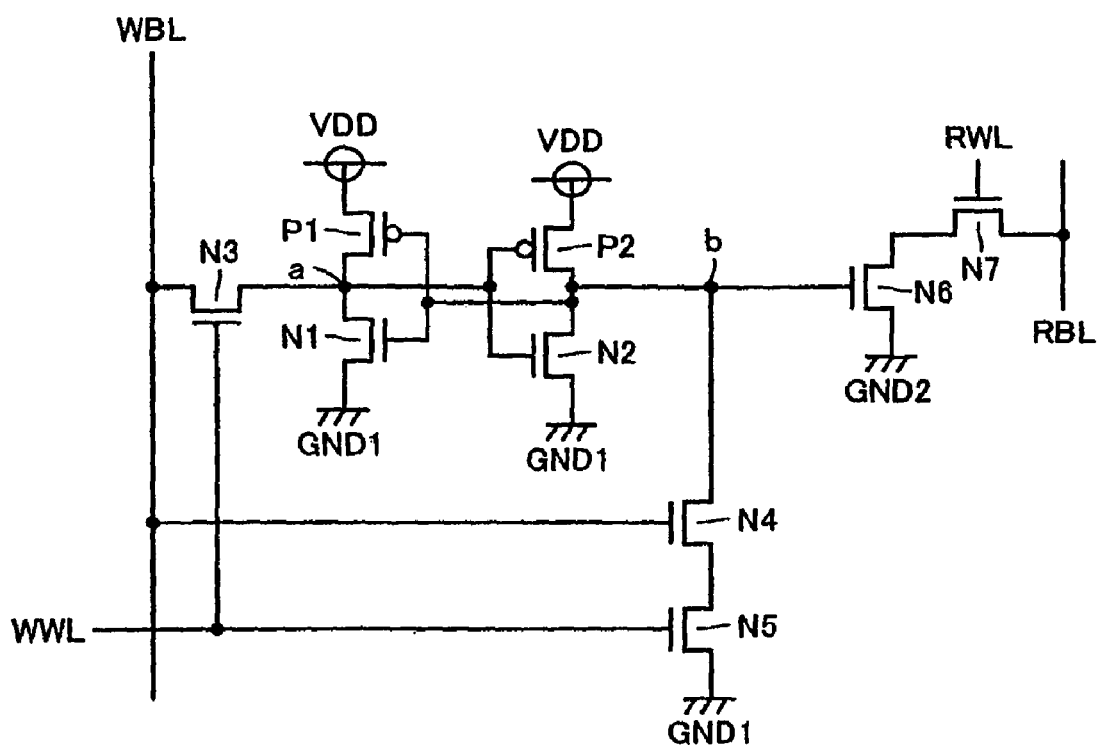
FIG. 5 is a diagram showing an equivalent circuit of a memory cell in an SRAM in a second embodiment of the present invention.

Referring to FIG. 5, the gate, source, and drain of nMOS transistor N3 are connected to write word line WWL, storage node "b", and write bit line WBL, respectively. The source of nMOS transistor N4 and the drain of nMOS transistor N5 are commonly connected. The gate and source of nMOS transistor N5 are electrically connected to write word line WWL and first ground line GND1, respectively. The gate and drain of nMOS transistor N4 are electrically connected to write bit line WBL and storage node "b", respectively. In such a manner, the first port is formed.

The configuration of the second port is substantially the same as that in the first embodiment except that the gate of nMOS transistor N6 is electrically connected to storage node "b" and different reference numerals and characters are used, so that its description will not be repeated.

By connecting the elements as described above, a two-port SRAM memory cell circuit having a port dedicated to writing and a port dedicated to reading is formed.

Since the other configuration is substantially the same as that in FIG. 1, the same reference numerals and characters are designated to the same elements and their description will not be repeated.

In the circuit configuration shown in FIG. 1, the first port can be used for both writing and reading operations. In the circuit configuration shown in FIG. 5, the first port is dedicated to writing operations.

The writing operation of the first port will be described hereinafter.

Storage nodes "a" and "b" are complementary to each other and correspond to non-inversion data and inversion data, respectively. In the data holding state, write word line WWL is at the "L" level and nMOS transistors N3 and N5 are in an OFF state. Therefore, each of storage nodes "a" and "b" is electrically disconnected from write bit line WBL and ground line GND1, so that storage nodes "a" and "b" are stable in a state where data is held.

When a writing operation starts, first, write data is driven to write bit line WBL. For example, in the case of writing data "1", write bit line WBL is driven to the "H" level. When write word line WWL is driven to the "H" level, nMOS transistors N3 and N5 are turned on. Since write bit line WBL is at the "H" level, nMOS transistor N4 is also in the ON state.

Therefore, storage node "b" is electrically connected to ground line GND1 via nMOS transistors N4 and N5, and storage node "a" is electrically connected to write bit line WBL via nMOS transistor N3, so that storage nodes "a" and "b" rise and fall to "H" and "L" levels, respectively. After that, when write word line WWL returns to "L" level, nMOS transistors N3 and N5 are turned off, so that storage nodes "a" and "b" become stable in a state where data of "H" level and "L" level are held, respectively. The operation of writing the data "1" into a memory cell is performed in such a manner.

On the other hand, in the case of writing data "0", write bit line WBL is driven to the "L" level. When write word line WWL is driven to the "H" level, nMOS transistors N3 and N5 are turned on. Since write bit line WBL is at the "L" level, nMOS transistor N4 is turned off. Therefore, storage node "b" is electrically disconnected from ground line GND1, and storage node "a" is electrically connected to write bit line WBL via nMOS transistor N3. Since write bit line WBL is at the "L" level, storage node "a" falls to "L" level. Consequently, pMOS transistor P2 is turned on and nMOS transistor N2 is turned off, so that storage node "b" rises to "H" level. After that, when write word line WWL returns to "L" level, nMOS transistors N3 and N5 are turned off. Therefore, storage nodes "a" and "b" become stable in a state where "L" level data and "H" level data is stored, respectively, thereby completing the writing of the data "0". In such a manner the writing operation of the first port is performed.

For example, when a writing operation is performed by one access transistor and one bit line WBL, there is a problem such that "H" level data is not easily written due to a substrate bias effect. However, in the circuit configuration shown in FIG. 5, data is written by always setting the bit line to the "L" level, so that the configuration has an advantage that a stable operation can be performed by a single bit line. Since the reading operation of the second port is substantially equal to that in the first embodiment, its description will not be repeated.

The layout of a memory cell of the embodiment will now be described.

Figure 6:
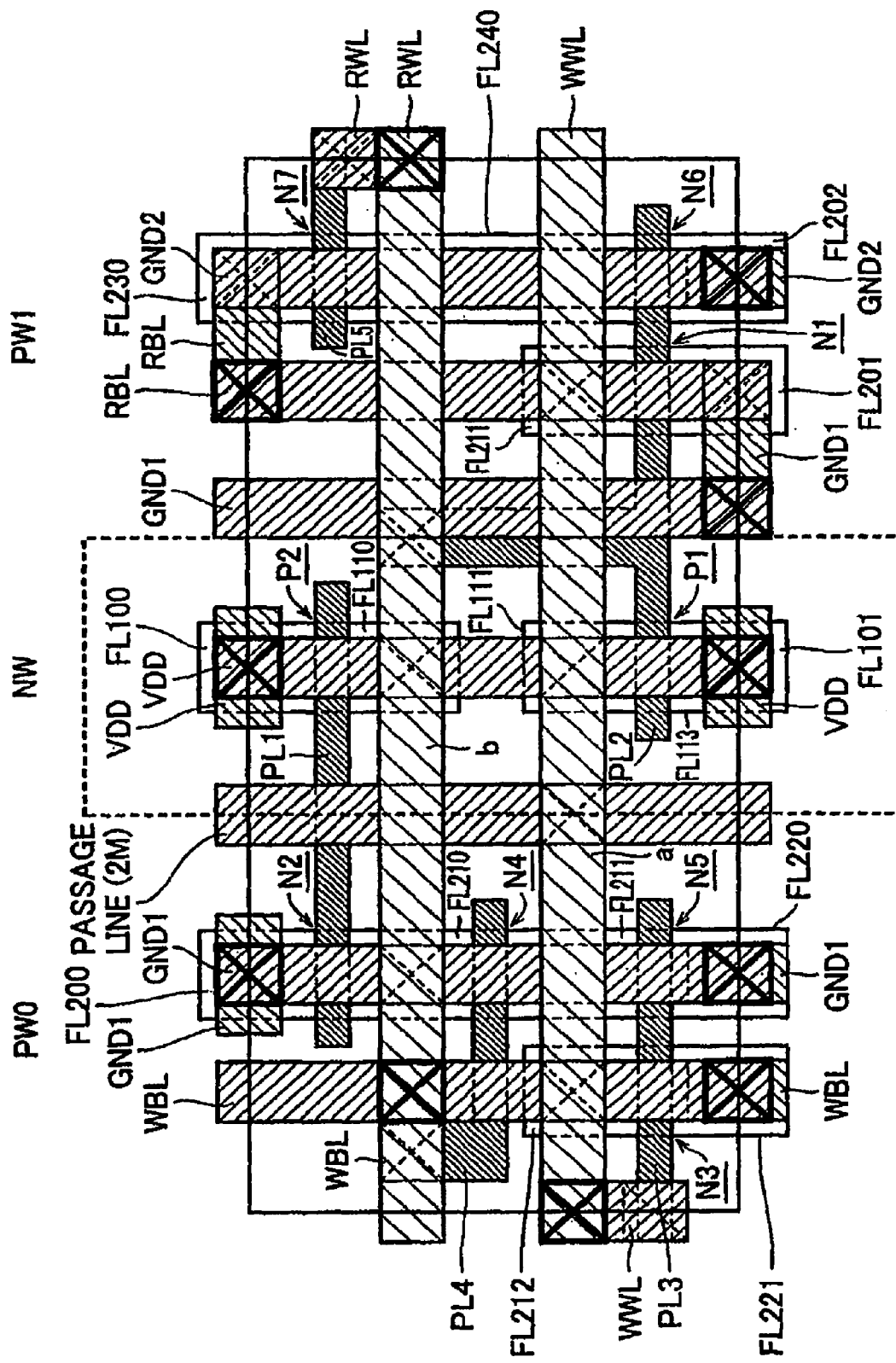
FIG. 6 is a schematic plan view showing the layout of a memory cell of the SRAM in the second embodiment of the present invention.
Figure 7:
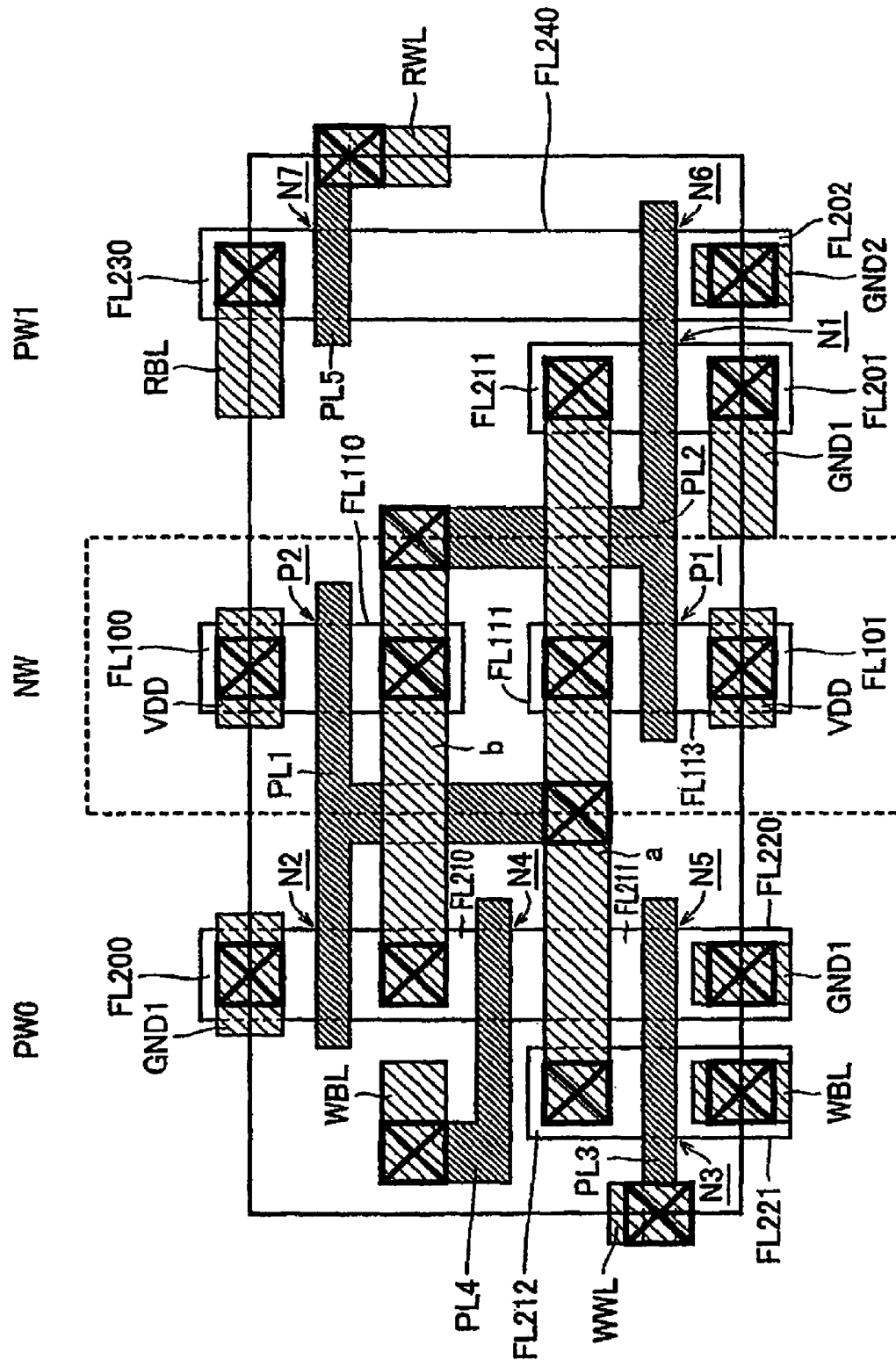
FIG. 7 is a schematic plan view showing the layout of the lower layer side in the stacking direction of the layout of FIG. 6.
Figure 8:
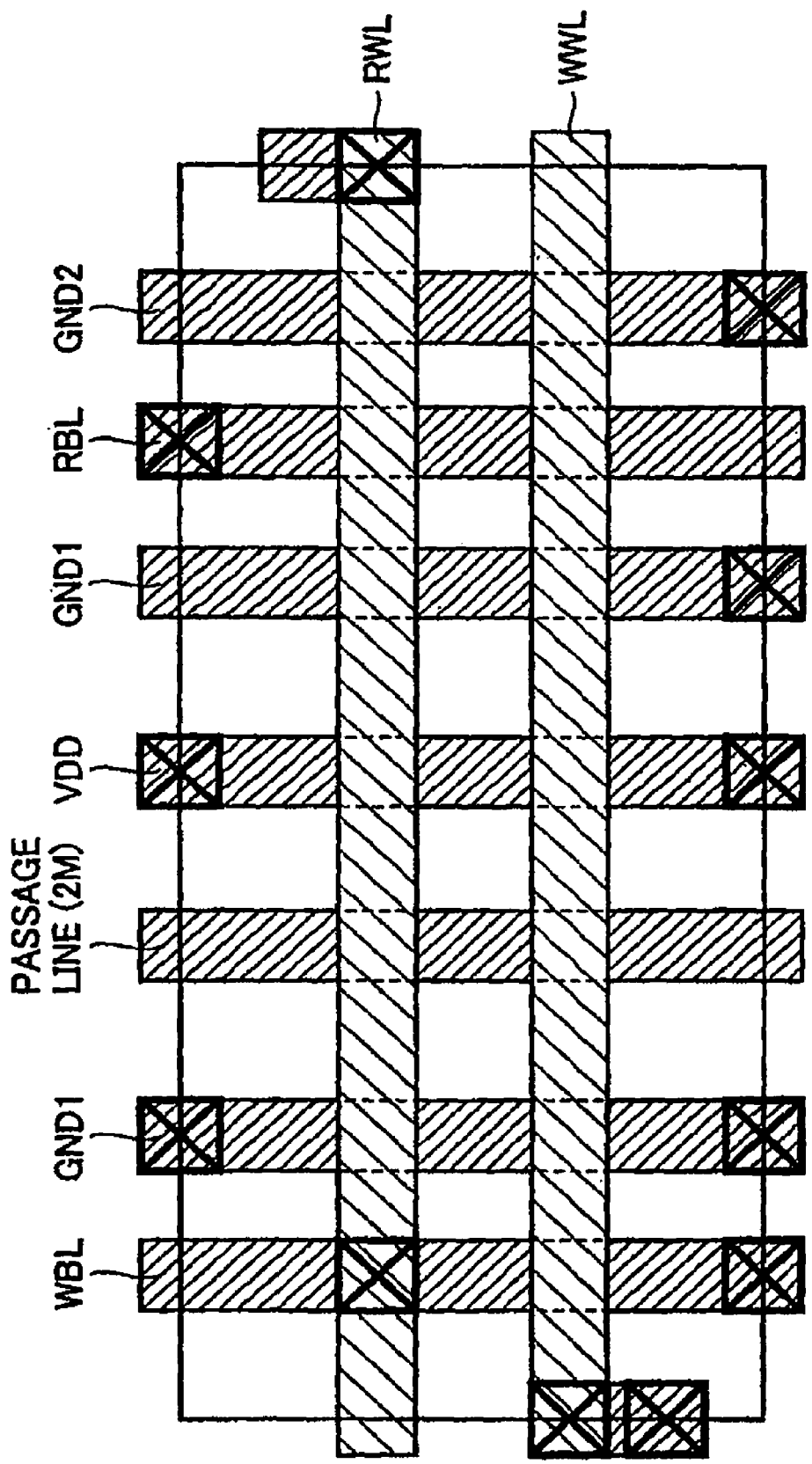
FIG. 8 is a schematic plan view showing the layout on the upper layer side in the stacking direction of the layout of FIG. 6.

With reference to FIGS. 6 to 8, one n-type well region NW and two p-type well regions PW0 and PW1 sandwiching n-type well region NW are formed in the surface of a semiconductor substrate. pMOS transistors P1 and P2 are formed in n-type well NW, nMOS transistors N2 to N5 are formed in p-type well PW0, and nMOS transistors N1, N6 and N7 are formed in p-type well PW1.

Referring mainly to FIG. 7, pMOS transistor P1 has a source and a drain formed by a pair of p-type diffusion regions FL100 and FL110, and gate PL1. pMOS transistor P2 has a source and a drain formed by a pair of p-type diffusion regions FL113 and FL111, and gate PL2.

nMOS transistor N2 has a source and a drain formed by a pair of n-type diffusion regions FL200 and FL210, and gate PL1. nMOS transistor N4 has a source and a drain formed by a pair of n-type diffusion regions FL211 and FL210, and gate PL4. nMOS transistor N5 has a source and a drain formed by a pair of n-type diffusion regions FL220 and FL211, and gate PL3. nMOS transistor N3 has a source and a drain formed by a pair of n-type diffusion regions FL212 and FL221, and gate PL3.

nMOS transistor N1 has a source and a drain formed by a pair of re-type diffusion regions FL201 and FL211, and gate PL2. AMOS transistor N6 has a source and a drain formed by a pair of n-type diffusion regions FL202 and FL240, and a gate PL3. nMOS transistor N7 has a source and a drain formed by a pair of n-type diffusion regions FL240 and FL230, and gate PL5.

The n-type diffusion regions are formed by doping active regions in p-type wells PW0 and PW1 with an n-type impurity. The p-type diffusion regions are formed by doping active regions in n-type well NW with a p-type impurity.

n-type diffusion region FL210 in nMOS transistor N2 and n-type diffusion region FL210 in nMOS transistor N4 are formed of a common diffusion region. n-type diffusion region FL211 in nMOS transistor N4 and n-type diffusion region FL211 in nMOS transistor N5 are formed of a common diffusion region. n-type diffusion region FL240 in nMOS transistor N6 and n-type diffusion region FL240 in nMOS transistor N7 are formed of a common diffusion region.

Gates PL2 of pMOS transistor P1 and nMOS transistors N1 and N6 are formed of a common doped polycrystalline silicon interconnection. Gates PL1 of pMOS transistor P2 and nMOS transistor N2 are formed of a common doped polycrystalline silicon interconnection. Gates PL3 of nMOS transistors N3 and N5 are formed of a common doped polycrystalline silicon interconnection.

Gate PL1, p-type diffusion region FL111, and n-type diffusion regions FL211 and FL212 are electrically connected to each other via a contact hole at low impedance by a first meal interconnection corresponding to storage terminal "a". Gate PL2, p-type diffusion region FL110, and n-type diffusion region FL210 are electrically connected to each other via a contact hole at low impedance by the first metal interconnection corresponding to storage terminal "b".

Referring to mainly FIGS. 7 and 8, different first metal interconnections are electrically connected to p-type diffusion regions FL100 and FL101 via a contact hole. The different first metal interconnections are electrically connected through a first via hole to the second metal interconnection which is at the VDD potential.

A first metal interconnection is electrically connected to n-type diffusion region FL210 via a contact hole, and is electrically connected to a second metal interconnection serving as write word line WBL of the first port via the first via hole. Different first metal interconnections are connected to n-type diffusion regions FL200 and FL220 via a contact hole and are electrically connected to a second metal interconnection serving as ground line GND1 through the first via hole.

A first metal interconnection is electrically connected to n-type diffusion region FL230 via a contact hole. A second metal interconnection serving as read bit line RBL of the second port is electrically connected to the first metal interconnection through the first via hole. A first metal interconnection is electrically connected to n-type diffusion region FL201 via a contact hole, and a second metal interconnection serving as ground line GND1 is electrically connected through the first via hole to the first metal interconnection. A first metal interconnection is electrically connected to n-type diffusion region FL202 via a contact hole, and a second metal interconnection serving as ground line GND2 is electrically connected to the first metal interconnection via the first via hole.

All the second metal interconnections routed in the memory cell region are disposed in parallel with each other and extend in the direction parallel to a boundary line between n-type well NW and p-type well PW0 and a boundary line between n-type well NW and p-type well PW1. A passage line made by the second metal interconnection may be disposed so as to be parallel to the second interconnections, for example, between the second metal interconnection at the VDD potential and the second metal interconnection serving as ground line GND.

A first metal interconnection is electrically connected to gate PL3 via a contact hole, a second metal interconnection is electrically connected to the first metal interconnection via the first via hole, and a third metal interconnection serving as write word line WWL of the first port is electrically connected to the second metal interconnection through a second via hole. A first metal interconnection is electrically connected to gate PL5 via a contact hole, a second metal interconnection is electrically connected to the first metal interconnection through a first via hole, and a third metal interconnection serving as read word line RWL of the second port is electrically connected to the second metal interconnection through a second via hole.

All of the third metal interconnections disposed in the memory cell region are also disposed parallel to each other and extend in the direction orthogonal to the boundary line between n-type well NW and p-type well PW0 and the boundary line between n-type well NW and p-type well PW1.

According to the embodiment, with the layout of the two-port memory cell as described above, in a manner similar to the first embodiment, the length of the bit lines can be shortened, so that the access time can be shortened. In addition, the orientations of the doped polycrystalline silicon interconnections become the same, so that the control on the gate dimension is facilitated. nMOS transistors N2 to N5 are disposed on one side of the region in which pMOS transistors P1 and P2 are formed (n-type well NW), and nMOS transistors N1, N6 and N7 are disposed on the other side of the region in which pMOS transistors P1 and P2 are formed (n-type well NW). Consequently, bit line WBL of the first port and bit line RBL of the second port can be routed apart from each other in different p-type wells, so that the configuration has an advantage that interference between the ports does not easily occur. Since the ground lines can be separately routed, noise reduction, leakage reduction, increase in processing speed, and the like can be achieved. As the layout shape of a memory cell is elongated in the lateral direction, the passage line can be provided in a cell by using the same wiring layer as that for the bit lines and the flexibility of designing is increased. There is consequently an advantage that the cost is lowered.

Third Embodiment

Figure 9:
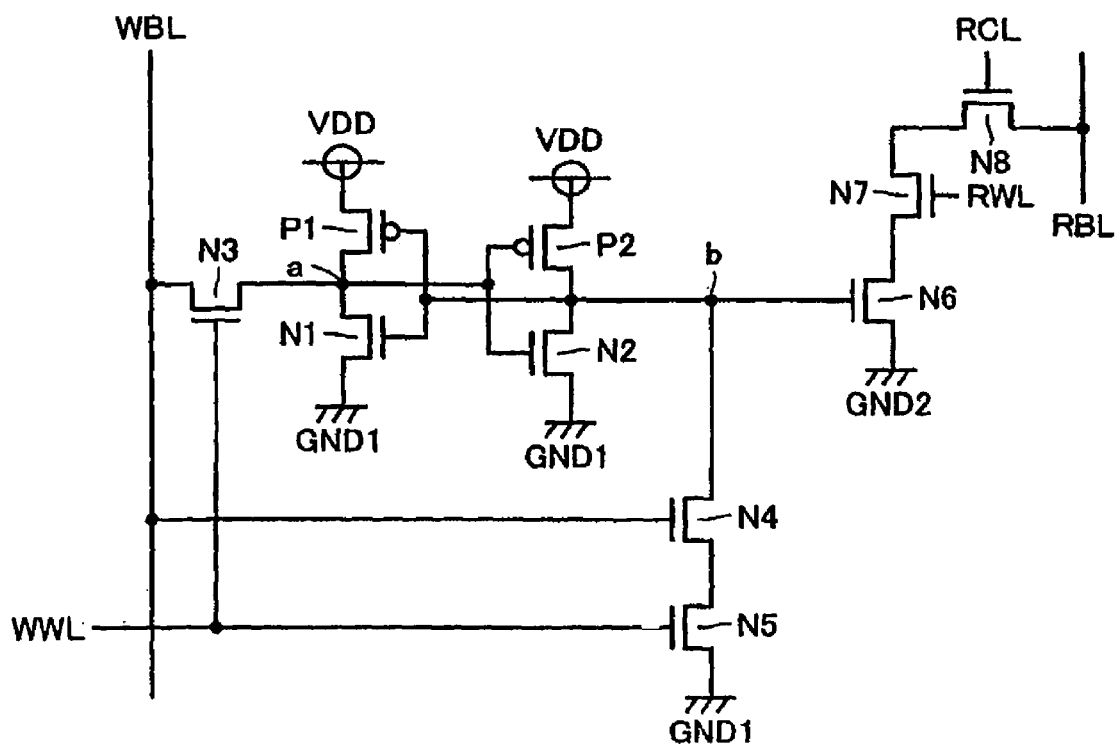
FIG. 9 is a diagram showing an equivalent circuit of a memory cell in an SRAM in a third embodiment of the present invention.

Referring to FIG. 9, the configuration of an equivalent circuit of a third embodiment is different from that of the equivalent circuit of the second embodiment shown in FIG. 5 with respect to the point that an nMOS transistor N8 is added to a read circuit part. The gate, drain and source of nMOS transistor N8 are electrically connected to a column selection signal RCL, a bit line RBL for reading and the drain of an nMOS transistor N7, respectively.

Since the other configuration is substantially the same as that of the equivalent circuit of the second embodiment shown in FIG. 5, the same reference numerals and characters are designated to the same elements and their description will not be repeated.

Column selection signal RCL is commonly connected to memory cells in the same column of a plurality of memory cells arranged in rows and columns. Column selection signal RCL of each memory cell column is selected by another address signal. Column selection signal RCL of selected one of the plurality of columns rises to "H" level and is selected. Data of only the selected column of which column selection signal RCL is at the "H" level and in which nMOS transistor N8 is ON is read to read bit line RBL. Since column selection signal RCL of a not-selected line is at the "L" level and nMOS transistor N8 is in the OFF state, the potential of read bit line RBL does not change. The configuration has a feature such that by applying the column selection signal in such a manner, power consumption due to turn-on of read bit line RBL in the not-selected column can be reduced.

The layout of the memory cell of the embodiment will now be described.

Figure 10:
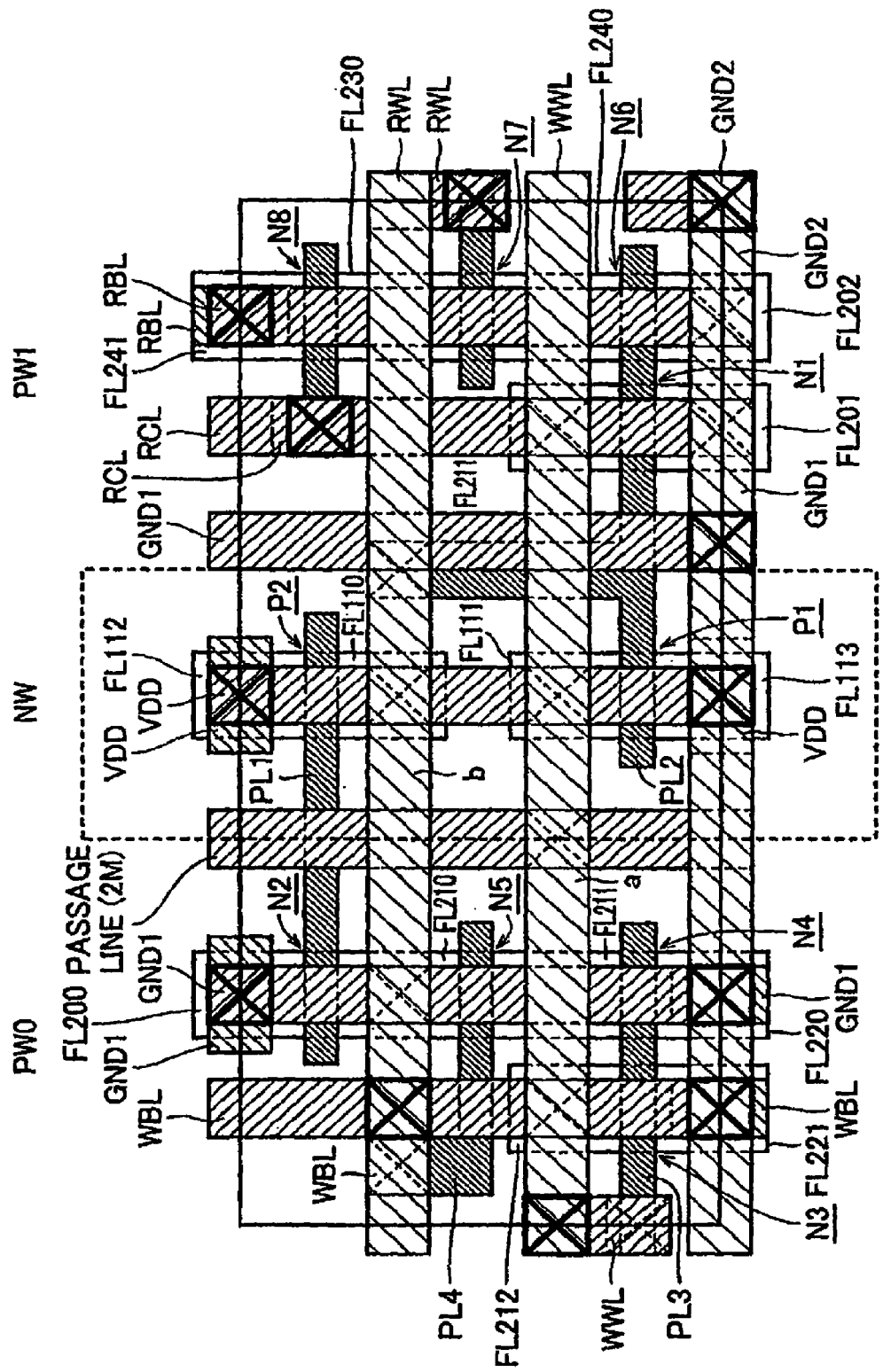
FIG. 10 is a schematic plan view showing the layout of a memory cell of the SRAM in the third embodiment of the present invention.
Figure 11:
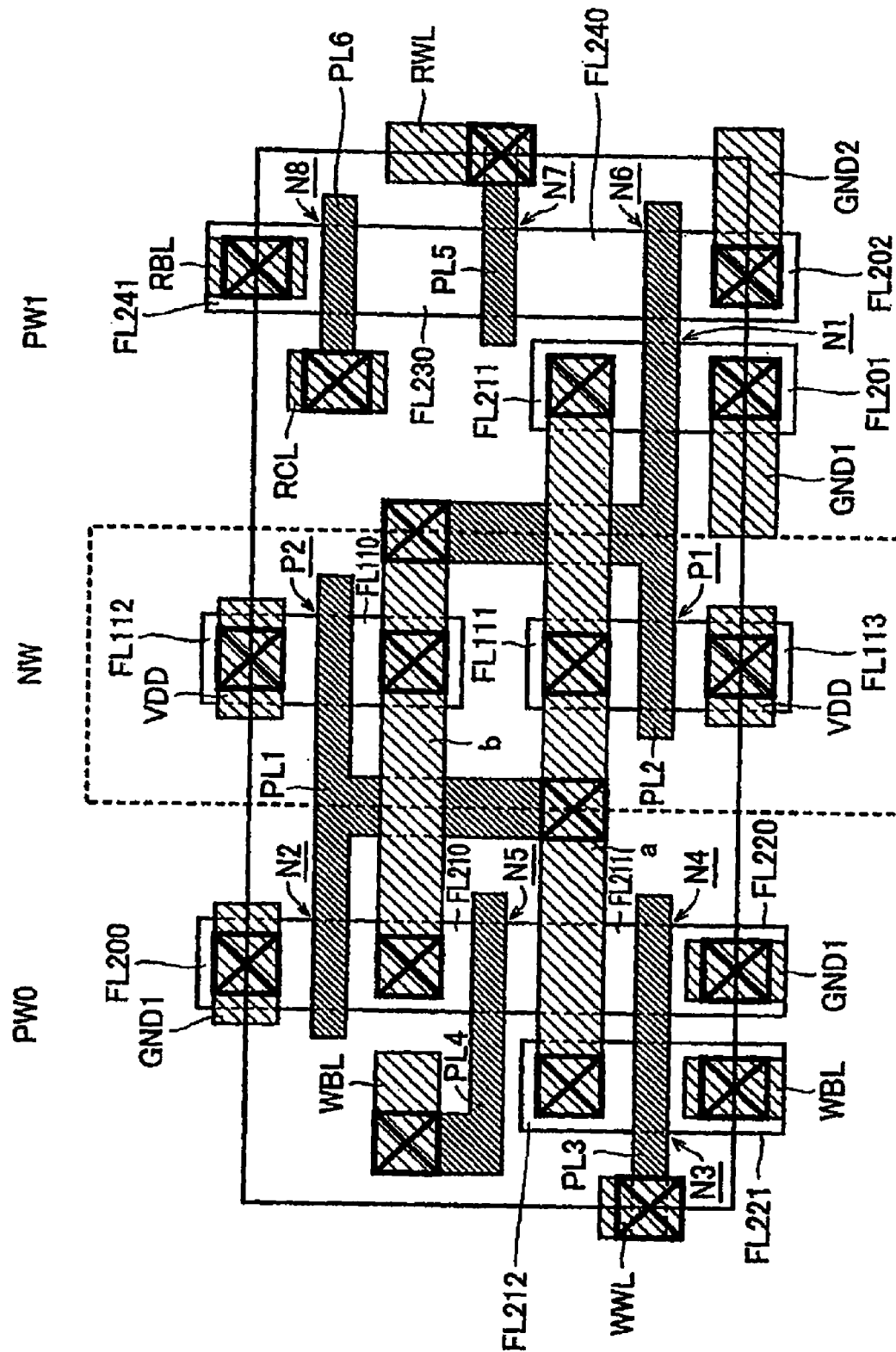
FIG. 11 is a schematic plan view showing the layout of the lower layer side in the stacking direction of the layout of FIG. 10.
Figure 12:
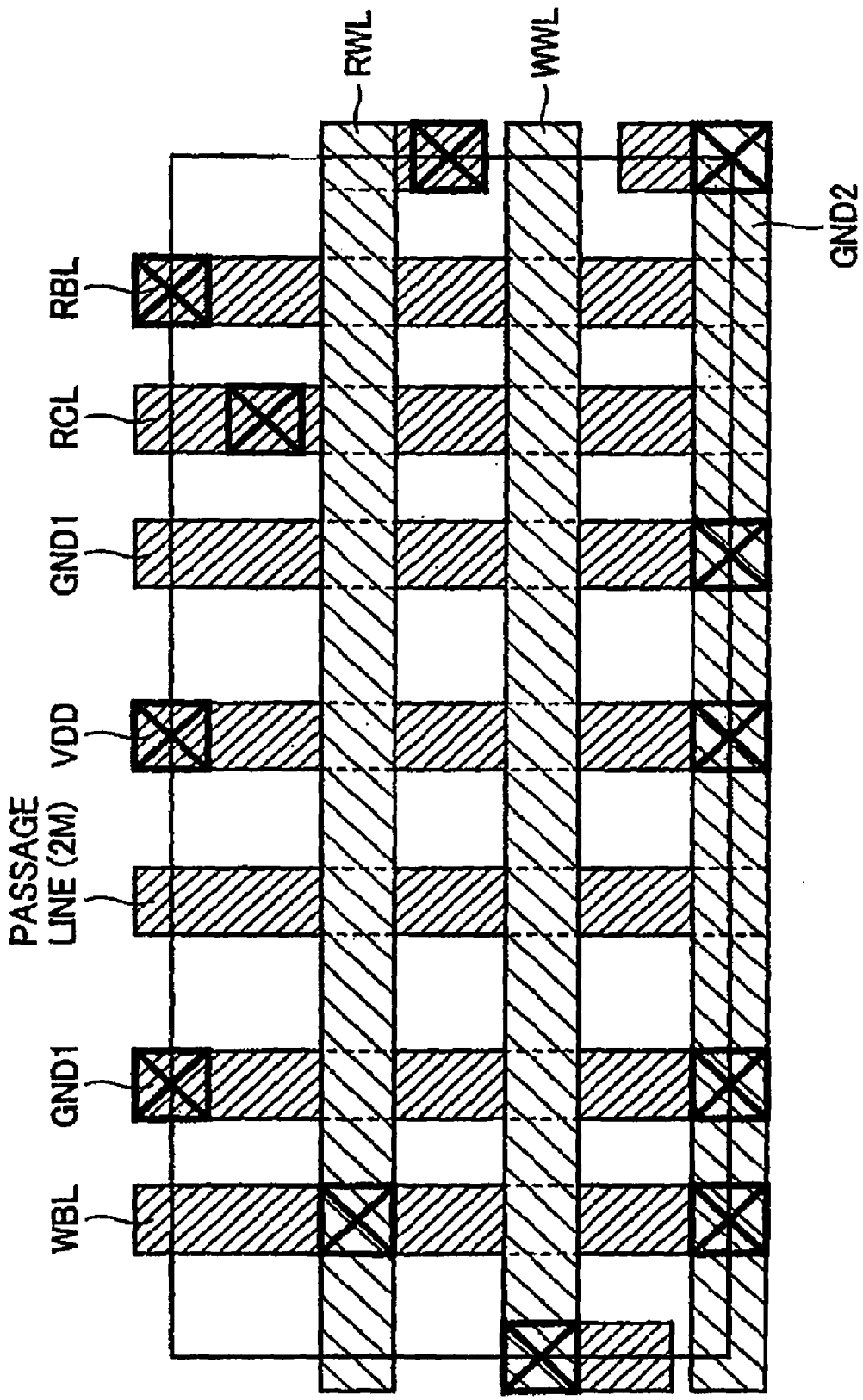
FIG. 12 is a schematic plan view showing the layout of the upper layer side in the stacking direction of the layout of FIG. 10.

With reference to FIGS. 10 to 12, the layout of the embodiment is different from that of FIGS. 6 to 8 mainly with respect to the point that nMOS transistor N8 and column selection signal line RCL are added and ground line GND2 is formed by a third metal interconnection.

Referring to mainly FIG. 11, nMOS transistor N8 is disposed in p-type well PW1. nMOS transistor N8 has a source and a drain formed by a pair of n-type diffusion regions FL230 and FL241, and a gate PL6. n-type diffusion region FL230 in nMOS transistor N8 and n-type diffusion region FL230 in nMOS transistor N7 axe made by a common diffusion region.

With reference to mainly FIGS. 11 and 12, a first metal interconnection is electrically connected to gate PL6 via a contact hole, and a second metal interconnection serving as column selection signal line RCL is electrically connected to the first metal interconnection through a first via hole. A first metal interconnection is electrically connected to n-type diffusion region FL241 via a contact hole, and a second metal interconnection serving as read bit line RBL of the second port is electrically connected to the first metal interconnection through a first via hole. A first metal interconnection is electrically connected to n-type diffusion region FL202 via a contact hole, a second metal interconnection is electrically connected to the first metal interconnection through a first via hole, and a third metal interconnection serving as ground line GND2 is electrically connected to the second metal interconnection through a second via hole.

Since the other layout is substantially the same as that of FIGS. 6 to 8, the same reference numerals and characters are designated to the same members and their description will not be repeated.

According to the embodiment, with the layout of the two-port memory cell as described above, in a manner similar to the first embodiment, the length of the bit lines can be shortened, so that the access time can be shortened. In addition, the orientations of the doped polycrystalline silicon interconnections become the same, so that control on the gate dimension is facilitated. nMOS transistors N2 to N5 are disposed on one side of the region in which pMOS transistors P1 and P2 are formed (n-type well NW), and nMOS transistors N1 and N6 to N8 are disposed on the other side of the region in which pMOS transistors P1 and P2 are formed (n-type well NW). Consequently, bit line WBL of the first port and bit line RBL of the second port can be routed apart from each other in different p-type wells, so that the configuration has an advantage that interference between the ports does not easily occur.

Since the ground lines can be separately routed, noise reduction, leakage reduction, increase in processing speed, and the like can be achieved. As the layout shape of a memory cell is elongated in the lateral direction, the passage line can be provided in a cell by using the same wiring layer as that for the bit lines and the flexibility of designing is increased. There is consequently an advantage that the cost is lowered. Further, an effect such that power consumption in a read bit line of a not-selected column can be reduced is produced.

Fourth Embodiment

A fourth embodiment relates to an associative memory. In recent years, it is demanded to mount a cache memory in a chip for higher processing speed of a computer. Since it takes time to access a large capacity memory on the outside of a chip, a method of increasing the processing speed of a CPU by transferring data recorded in an address space in an external memory into a high-speed cache memory in the chip is employed. In this case, it is necessary to instantaneously retrieve whether data is transferred to a cache memory or not. An associative memory has the associative retrieval function.

Figure 13:
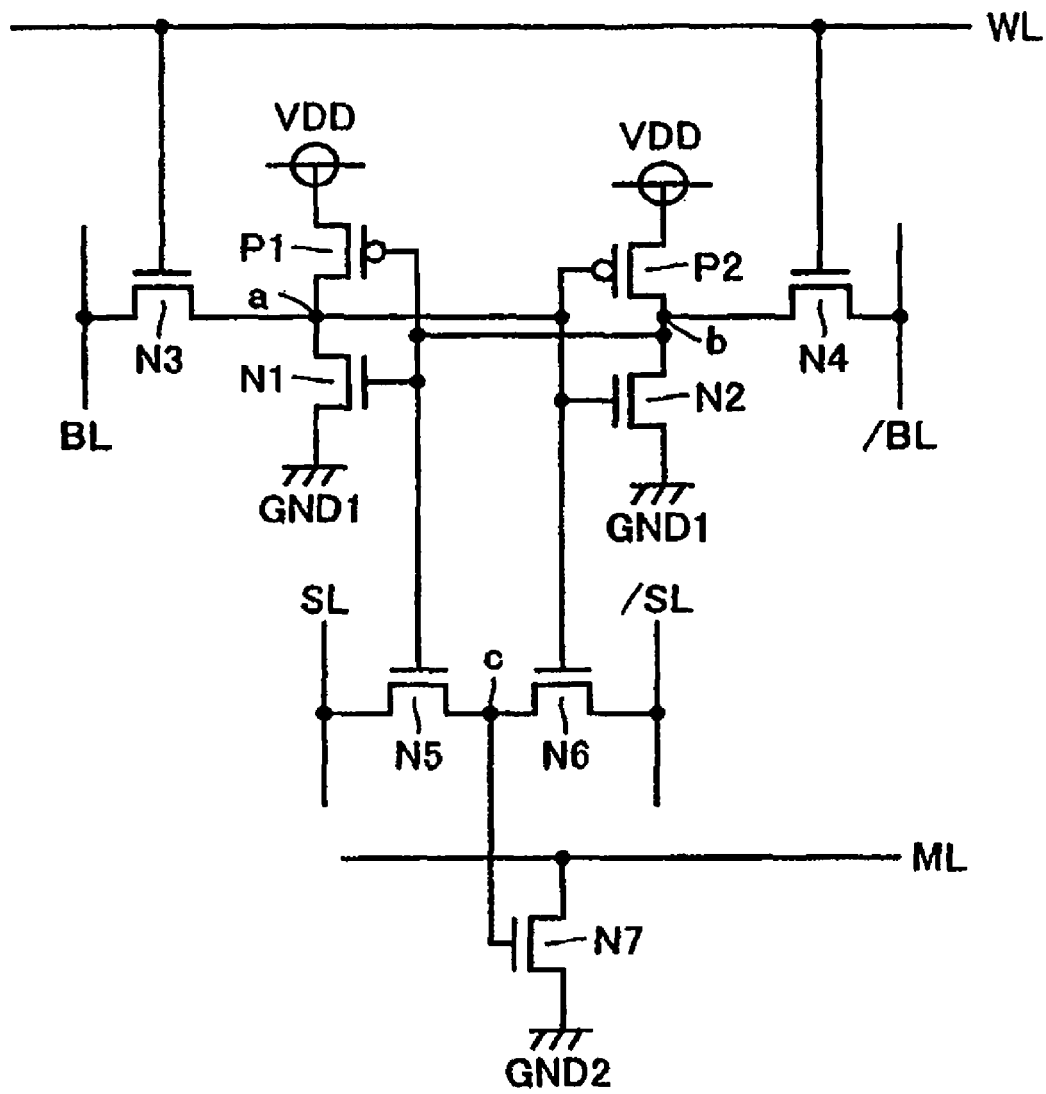
FIG. 13 is a diagram showing an equivalent circuit of a memory cell in an SRAM in a fourth embodiment of the present invention.
Figure 23:
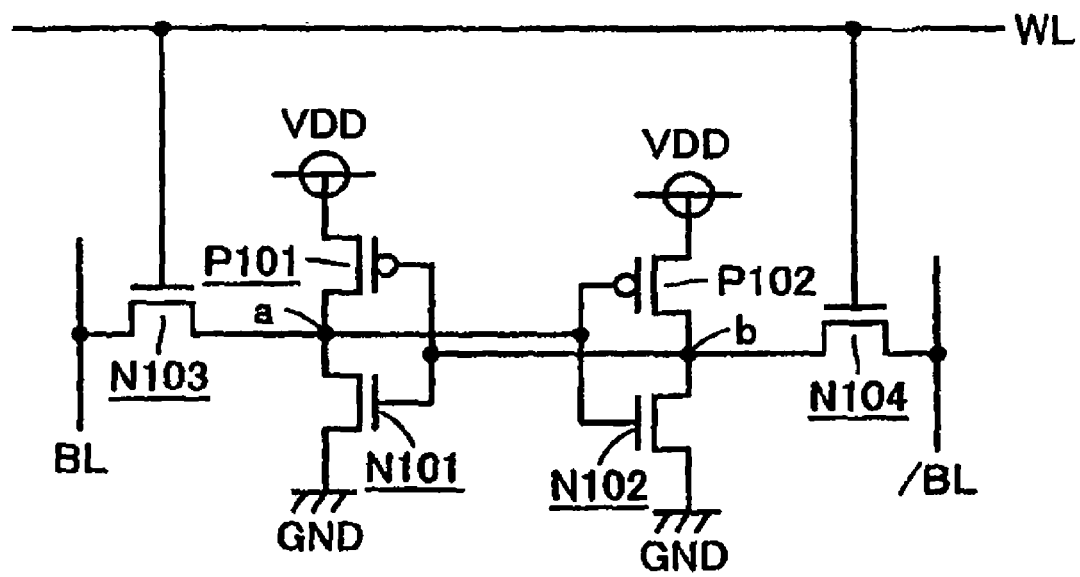
FIG. 23 is a diagram showing an equivalent circuit of a memory cell of a general SRAM.
Figure 24:
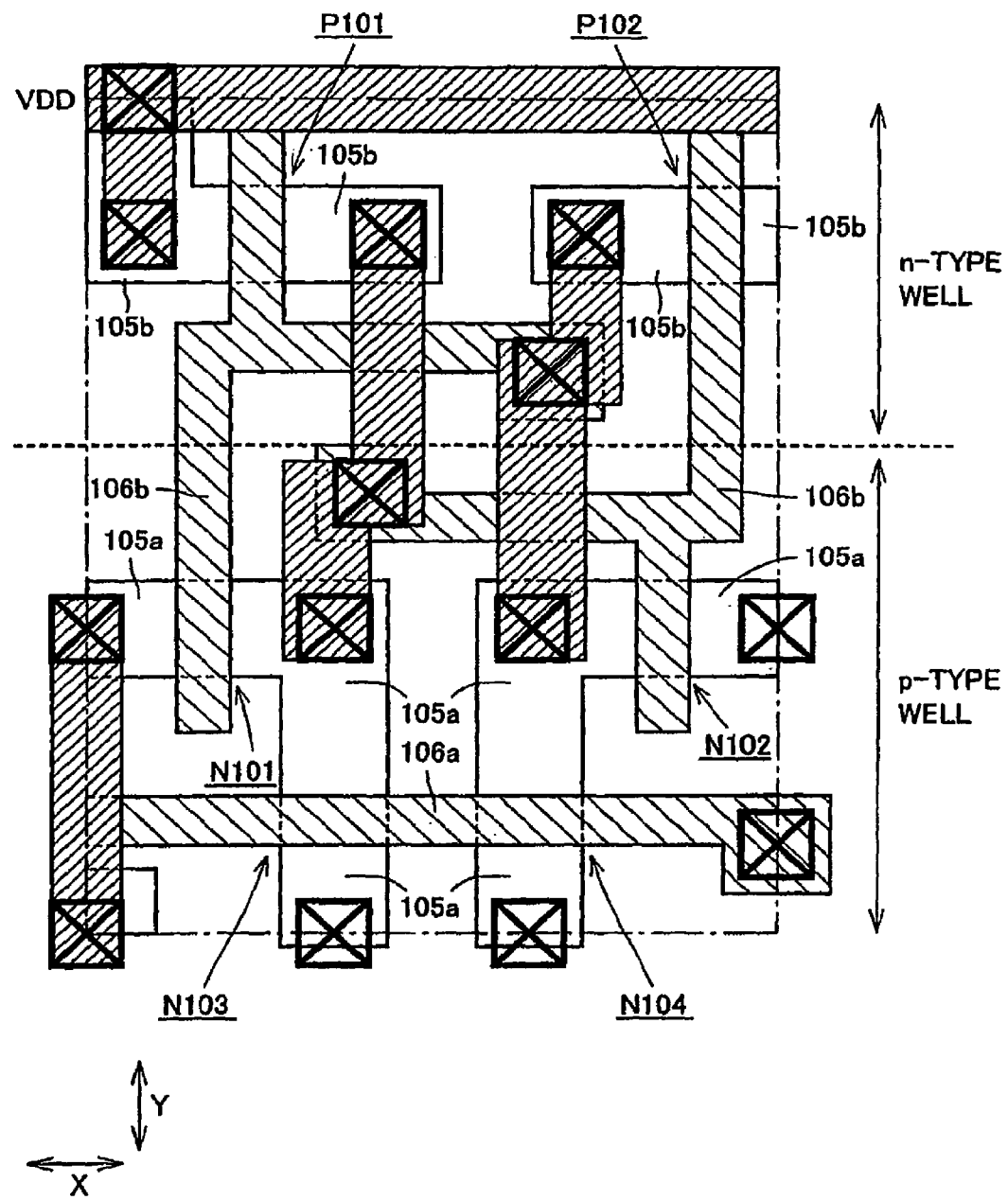
FIG. 24 is a schematic plan view showing the layout of a conventional 6 transistor type SRAM memory cell.
Figure 25:
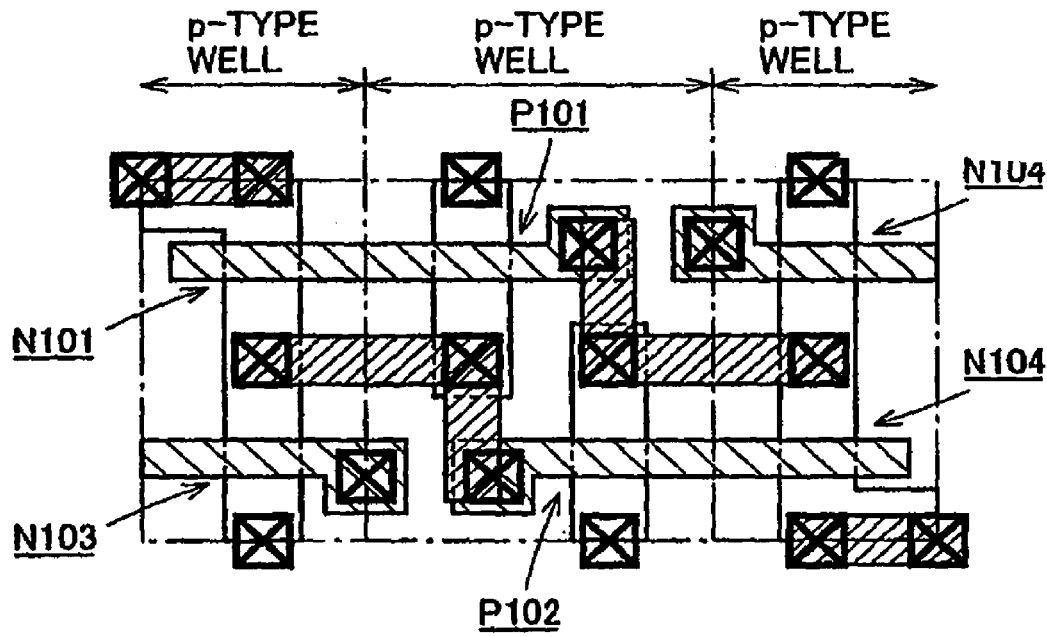
FIG. 25 is a schematic plan view showing the layout of a lower layer side of an SRAM memory cell disclosed in Japanese Patent Laying-Open No. 10-178110.
Figure 26:
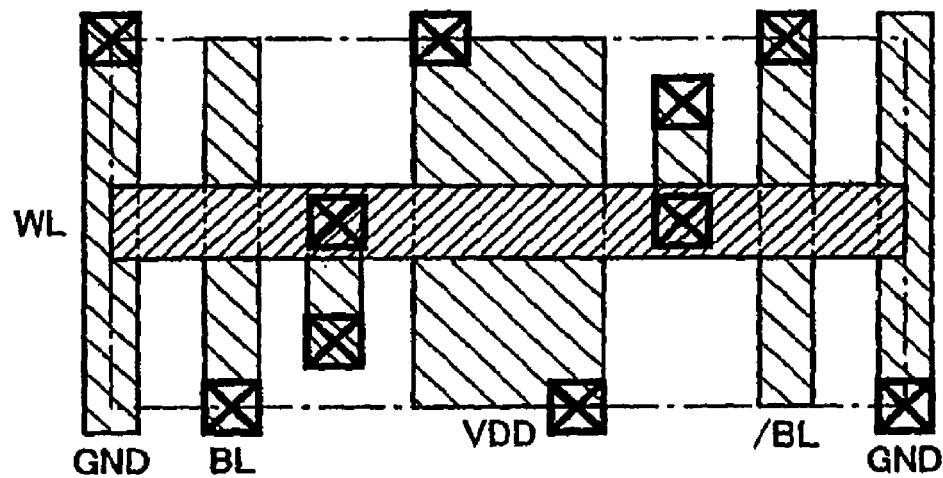
FIG. 26 is a schematic plan view showing the layout of an upper layer side of the SRAM memory cell disclosed in Japanese Patent Laying-Open No. 10-178110.

Referring to FIG. 13, the configuration of a pair of driver transistors N1 and N2, a pair of access transistors N3 and N4; and a pair of load transistors P1 and P2 is substantially the same as that in the conventional equivalent circuit shown in FIG. 23 except for reference numerals and characters, so that its description will not be repeated. In the fourth embodiment, nMOS transistors N5 to N7 are added to the storage circuit.

The drains of nMOS transistors N5 and N6 are electrically connected to each other, thereby forming an internal node "c". The source and gate of nMOS transistor N5 are connected to search line SL and storage node "b", respectively. The source and gate of nMOS transistor N6 are electrically connected to a search line /SL and storage node "a", respectively. The gate, source, and drain of nMOS transistor N7 are connected to internal node "c", ground line GND2, and a match line ML, respectively. In such a manner, an associative memory is formed.

A retrieving operation of the associative memory will now be described.

In an initial state, a pair of search lines SL and /SL are at the "L" level. When it is assumed that data at storage nodes "a" and "b" are at the "H" and "L" levels, respectively, nMOS transistor N6 is in the ON state and nMOS transistor N5 is in the OFF state. Therefore, internal node "c" can be electrically connected to search line /SL via nMOS transistor N6 and falls to "L" level. Since nMOS transistor N7 is in the OFF state, a match line ML and ground line GND2 are electrically disconnected from each other. Match line ML is precharged to the "H" level.

When the retrieving operation starts, according to data to be retrieved, either search line SL or /SL is driven from the "L" level to the "H" level. Assuming now that, as retrieval data, search line SL is maintained at the "L" level and search line /SL is driven to the "H" level to check whether data stored in storage node "a" is at the "H" or "L" level. Since nMOS transistor N5 is in the OFF state and nMOS transistor N6 is in the ON state, internal node "c" can be electrically connected to search line /SL and therefore rises to "H" level, and nMOS transistor N7 is turned on. Match line ML is electrically connected to ground line GND2 via nMOS transistor N7. Therefore, match line ML changes from the initial state of the "H" level to the "L" level, and information of "mismatch" is obtained as a result of the retrieval operation.

On the other hand, as retrieval data, it is assumed that search line /SL is maintained at the "L" level and search line SL is driven to the "H" level. In this case, since internal node "c" is electrically connected to search line /SL via nMOS transistor N6, internal node "c" is at the L level. nMOS transistor N7 is in the OFF state, match line ML is electrically disconnected from ground potential GND2, and match line ML is held at the "H" level as the initial precharge state. As a result, information of "match" is obtained as a result of the retrieval operation. After that, the pair of search lines SL and /SL are reset to the "L" level, and match line ML is precharged again to the "H" level, thereby completing the retrieval operation.

Since normal reading and writing operations are the same as those in the first embodiment, their description will not be repeated.

The layout in plan view of the associative memory cell will now be described.

Figure 14:
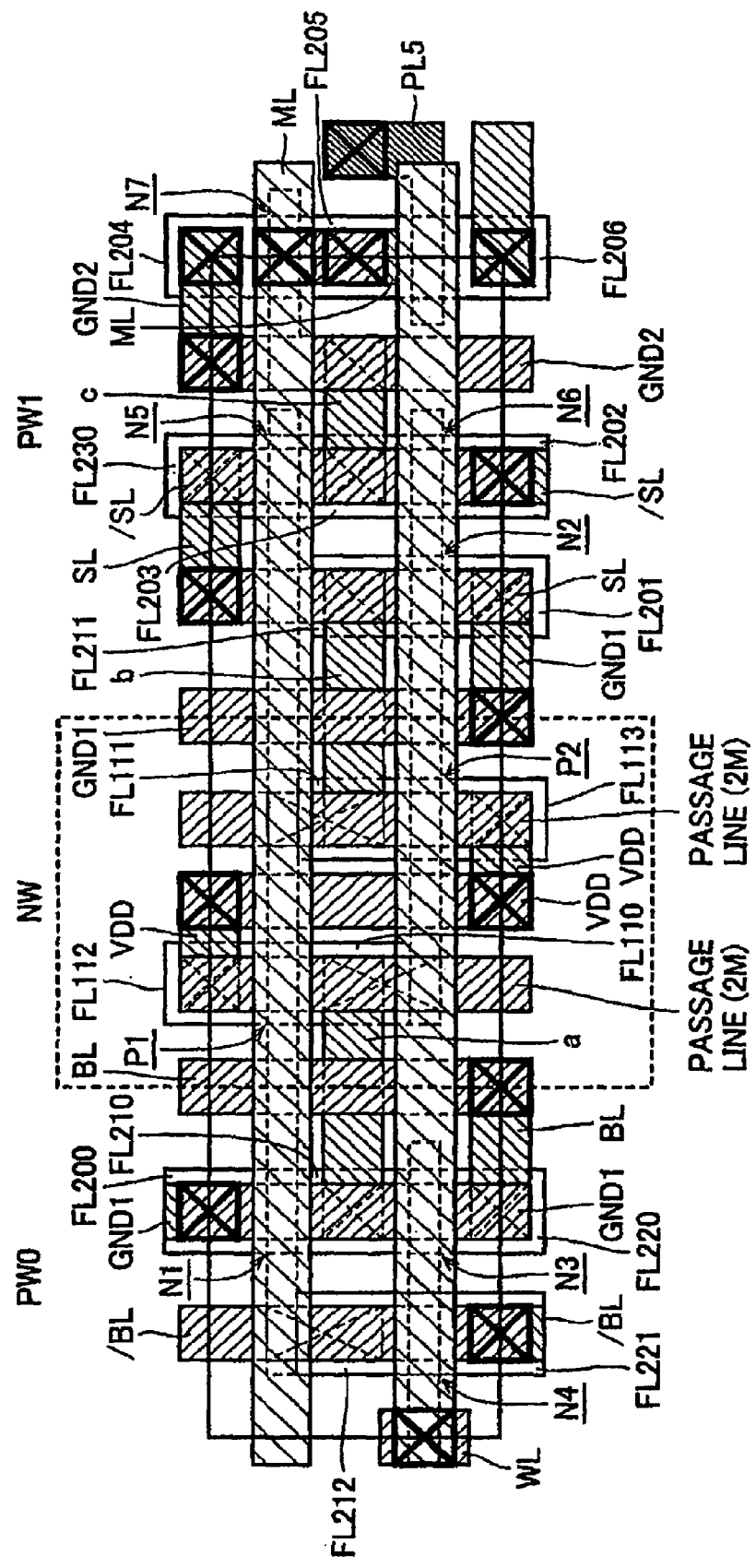
FIG. 14 is a schematic plan view showing the layout of a memory cell of the SRAM in the fourth embodiment of the present invention.
Figure 15:
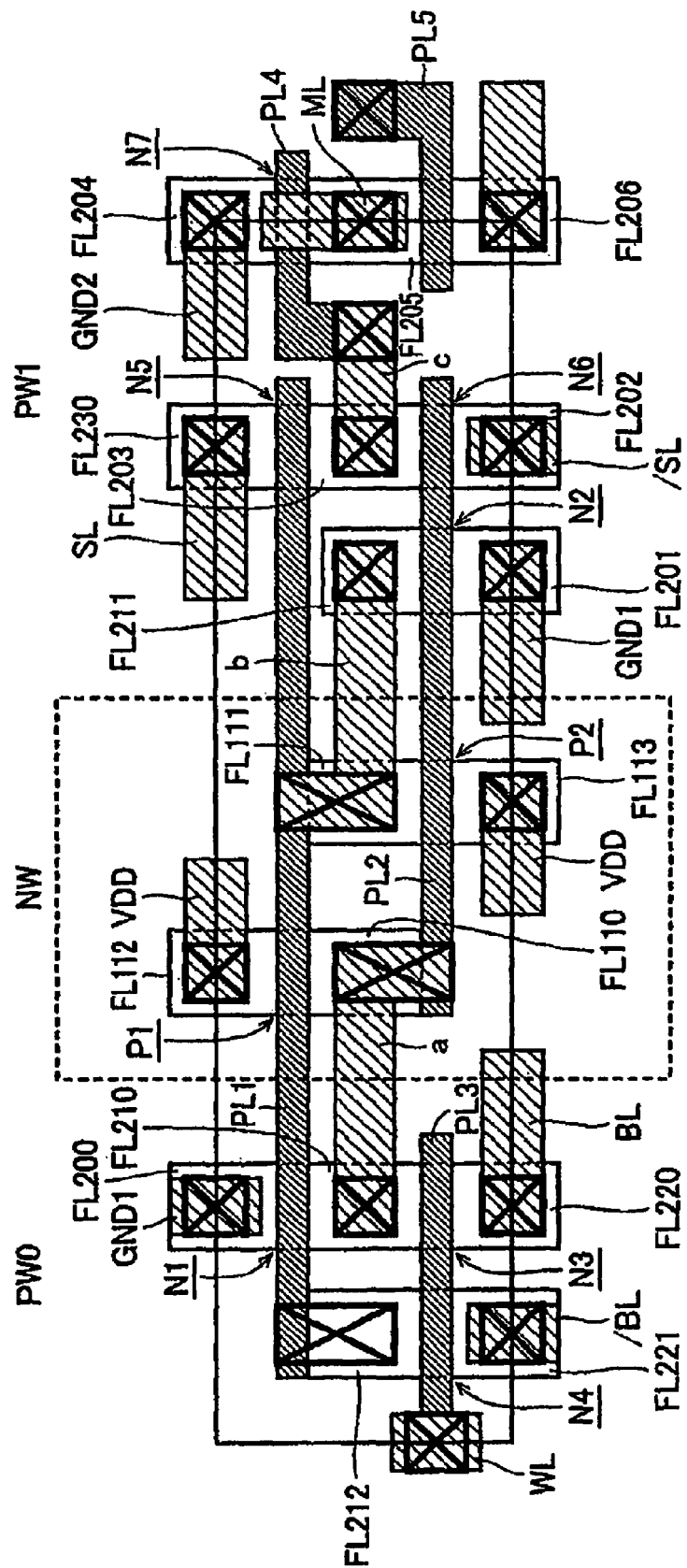
FIG. 15 is a schematic plan view showing a layout of the lower layer side in the stacking direction of the layout of FIG. 14.
Figure 16:
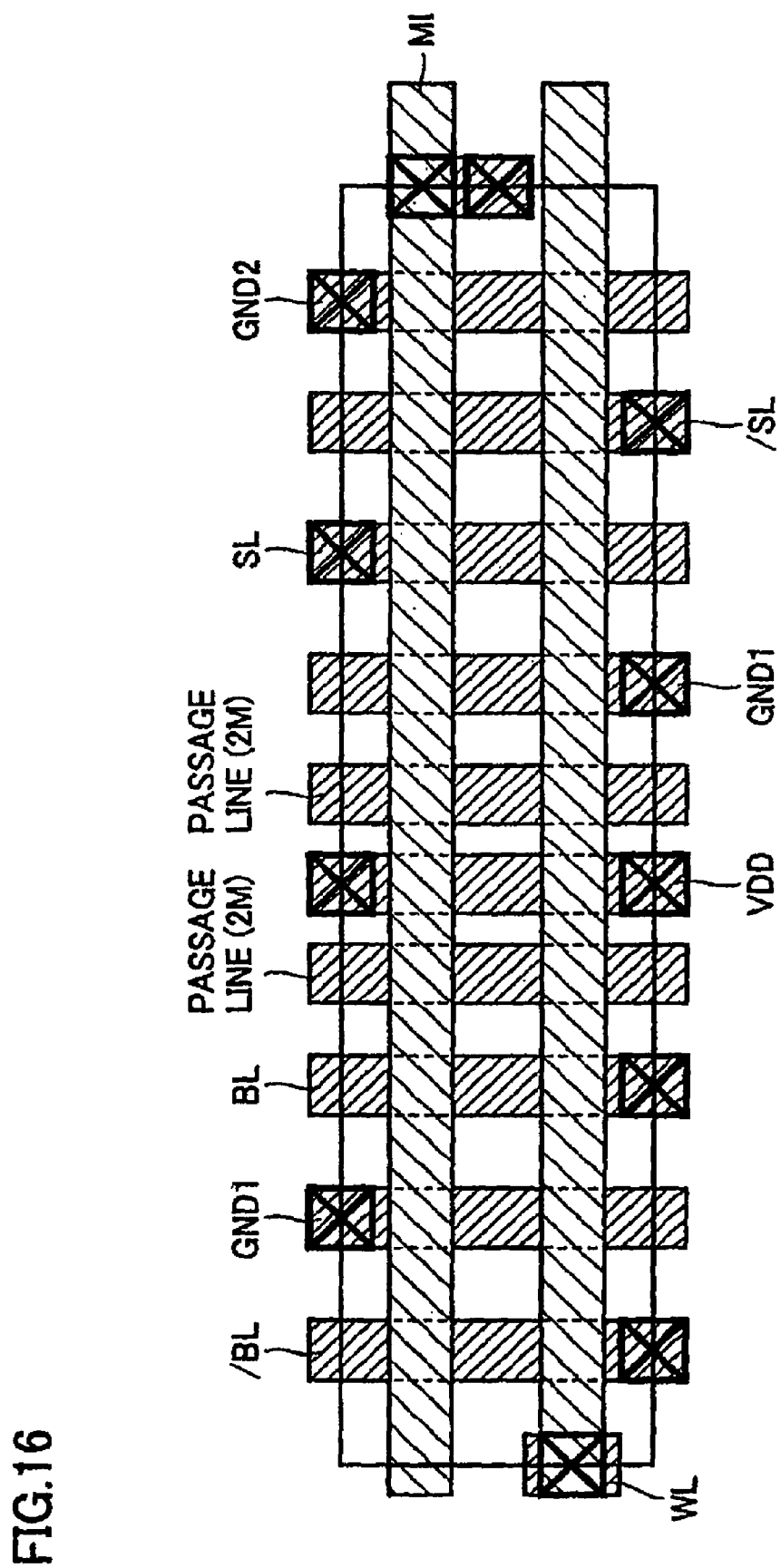
FIG. 16 is a schematic plan view showing the layout of the upper layer side in the stacking direction of the layout of FIG. 14.

Referring to FIGS. 14 to 16, the layout of the embodiment is different from that of FIGS. 2 to 4 mainly with respect to the point that nMOS transistors N5 to N8 for associative memory are provided in place of nMOS transistors N5 and N6 forming the port dedicated to reading and with respect to the point that the pair of search lines SL and /SL and match line ML are provided in place of read bit line RBL and read word line RWL.

Each of nMOS transistors N5 to N7 for an associative memory is formed in p-type well PW1. nMOS transistor N5 has a source and a drain formed by a pair of n-type diffusion regions FL230 and FL203, and gate PL1. nMOS transistor N6 has a source and a drain made by a pair of n-type diffusion regions FL202 and FL203, and gate PL2. nMOS transistor N7 has a source and a drain made by a pair of n-type diffusion regions FL204 and FL205, and gate PL4.

n-type diffusion regions FL203 of nMOS transistors N5 and N6 are formed by a common diffusion region and electrically connected to gate PL4 by a first metal interconnection via a contact hole. Gate PL1 of nMOS transistor N5, gate PL1 of nMOS transistor N1 and gate PL1 of pMOS transistor P1 are formed of a common doped polycrystalline silicon interconnection. Gate PL2 of nMOS transistor N6, gate PL2 of nMOS transistor N2, and gate PL2 of pMOS transistor P2 are formed of a common doped polycrystalline silicon interconnection.

A first metal interconnection is electrically connected to n-type diffusion region FL230 via a contact hole, and a second metal interconnection serving as search line SL is electrically connected to the first metal interconnection via a first via hole. A first metal interconnection is electrically connected to n-type diffusion region FL202 via a contact hole, and a second metal interconnection serving as search line /SL is electrically connected to the first metal interconnection through a first via hole. A first metal interconnection is electrically connected to n-type diffusion region FL204 via a contact hole, and a second metal interconnection serving as ground line GND2 is electrically connected to the first metal interconnection through a first via hole. The second metal interconnections extend in parallel with other second metal interconnections.

A first metal interconnection is electrically connected to gate PL4 via a contact hole, a second metal interconnection is electrically connected to the first metal interconnection through a first via hole, and a third metal interconnection serving as match line ML is electrically connected to the second metal interconnection through a second via hole. Match line ML extends in parallel with word line WL.

Since the other layout is substantially the same as that shown in FIGS. 2 to 4, the same reference numerals and characters are designated to the same members, and their description will not be repeated.

According to the embodiment, by designing the layout of the associative memory cell as described above, in a manner similar to the first embodiment, the length of a bit line can be shortened, so that the access time can be shortened. Since the orientations of the doped polycrystalline silicon interconnections become the same, the control on the gate length is facilitated. As the ground lines can be separately routed, prevention of noise, reduction in leak current, increase in processing speed, and the like can be achieved.

Since the layout of the memory cell is elongated in the lateral direction, a passage line can be provided in a cell by using the same wiring layer as that of a bit line. Consequently, flexibility of designing is increased and there is an advantage that cost can be reduced. Further, an effect that power consumption in a read bit line in a not-selected column can be reduced is produced.

Fifth Embodiment

Figure 17:
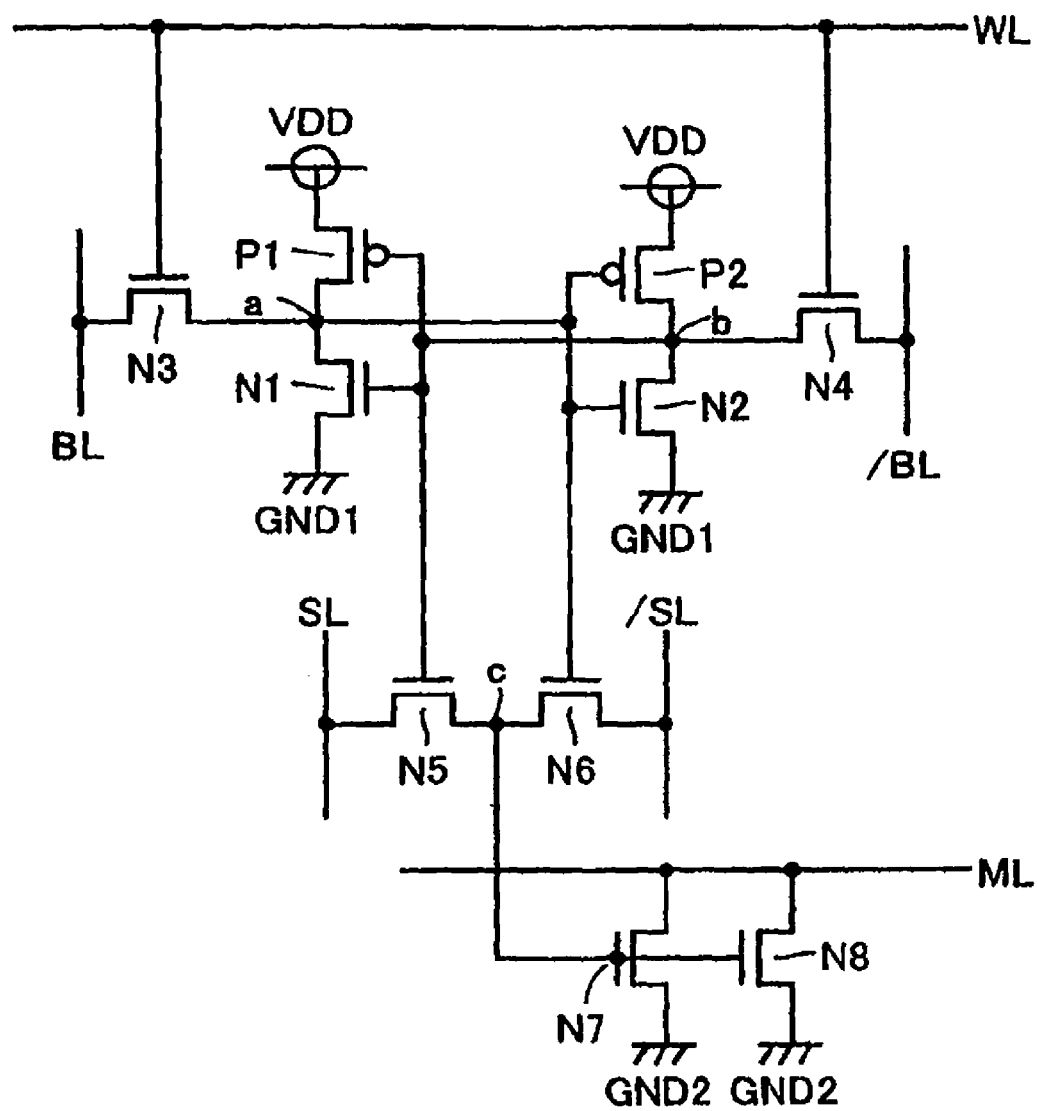
FIG. 17 is a diagram showing an equivalent circuit of a memory cell in an SRAM in a fifth embodiment of the present invention.

Referring to FIG. 17, the configuration of an equivalent circuit of a fifth embodiment is different from that of the fourth embodiment shown in FIG. 13 with respect to the point that nMOS transistor N8 is added. The gate, source and drain of nMOS transistor N8 are electrically connected to internal node "c", ground potential GND2 and match line ML, respectively.

Since the other configuration of the equivalent circuit is substantially the same as that shown in FIG. 13, the same reference numerals and characters are designated to the same elements, and their description will not be repeated.

The layout in plan view of the associative memory cell will now be described.

Figure 18:
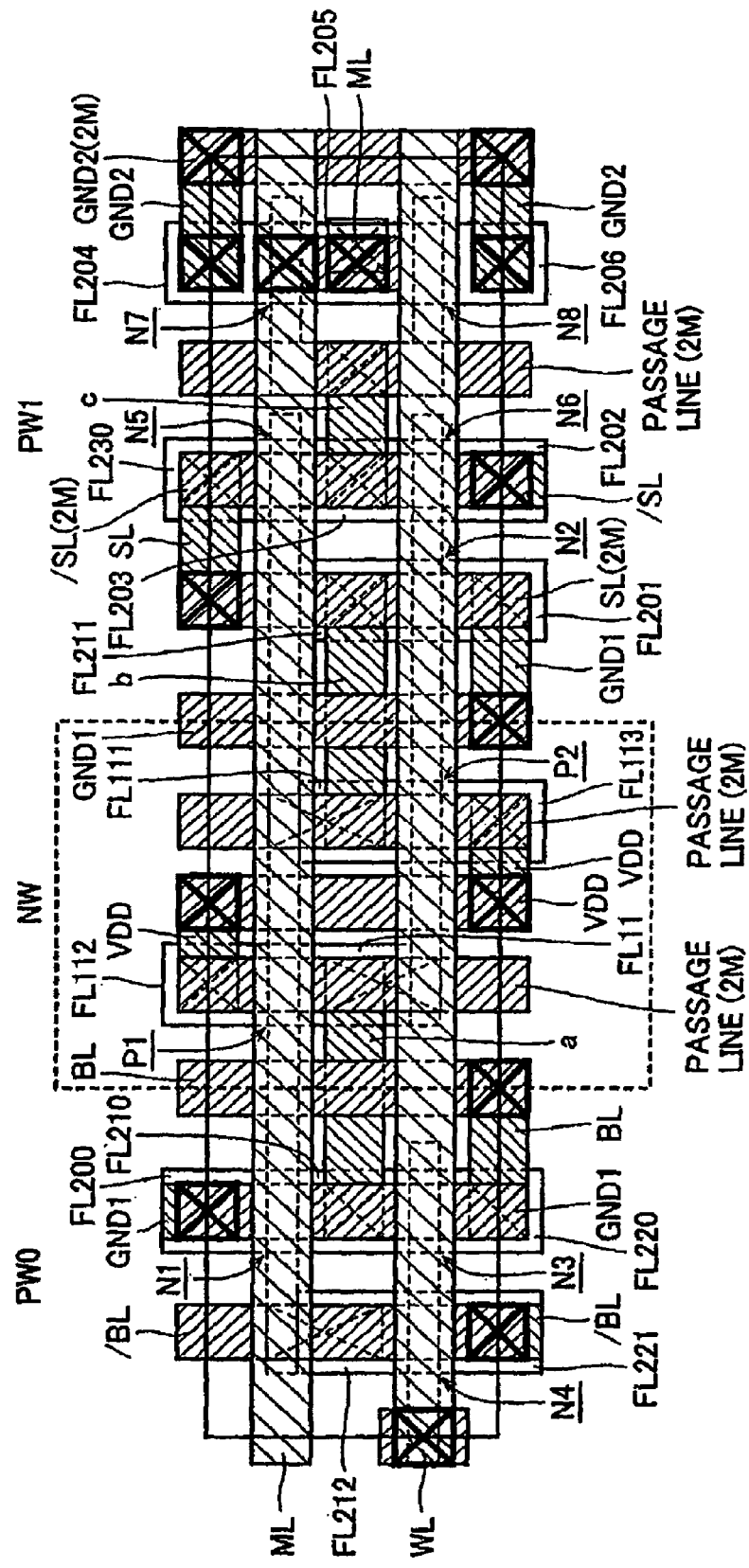
FIG. 18 is a schematic plan view showing the layout of a memory cell in the SRAM in the fifth embodiment of the present invention.
Figure 19:
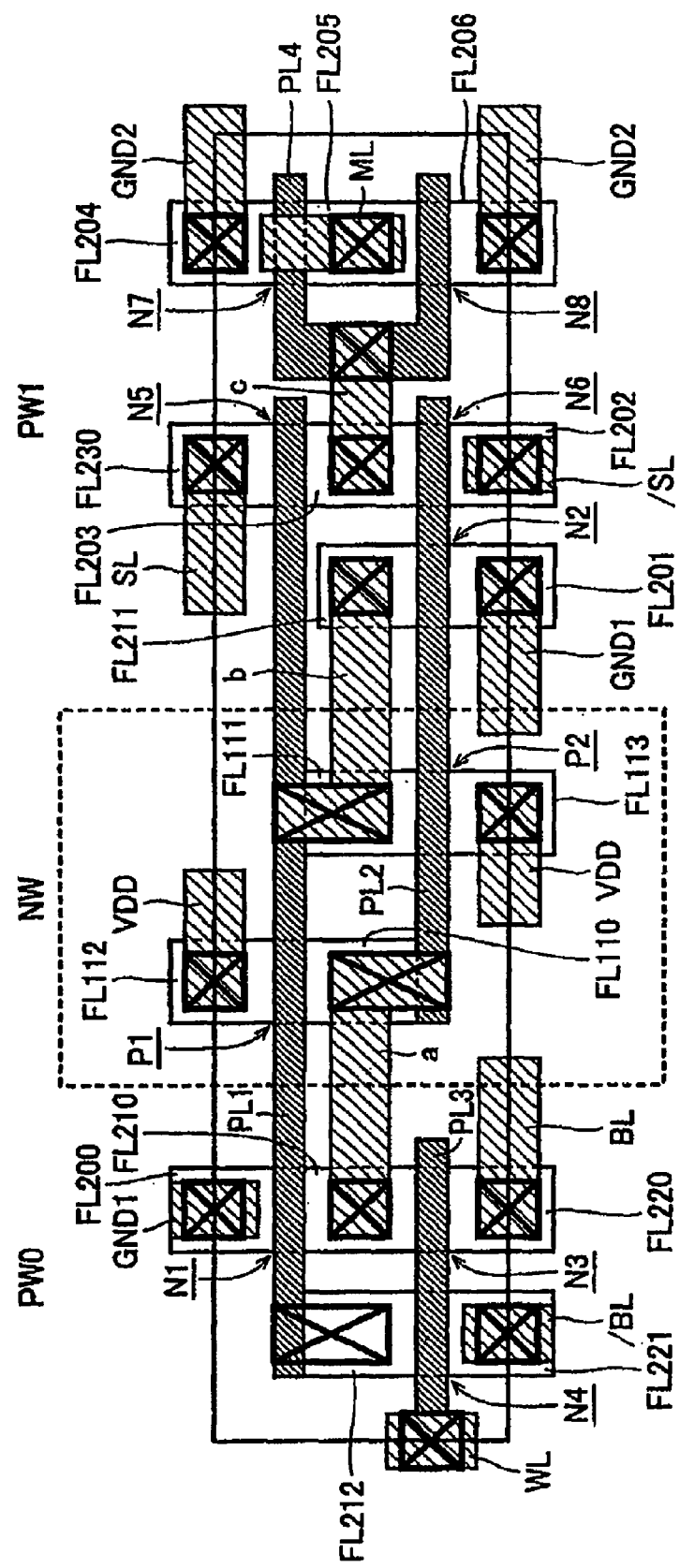
FIG. 19 is a schematic plan view showing the layout of the lower layer side in the stacking direction of the layout of FIG. 18.
Figure 20:
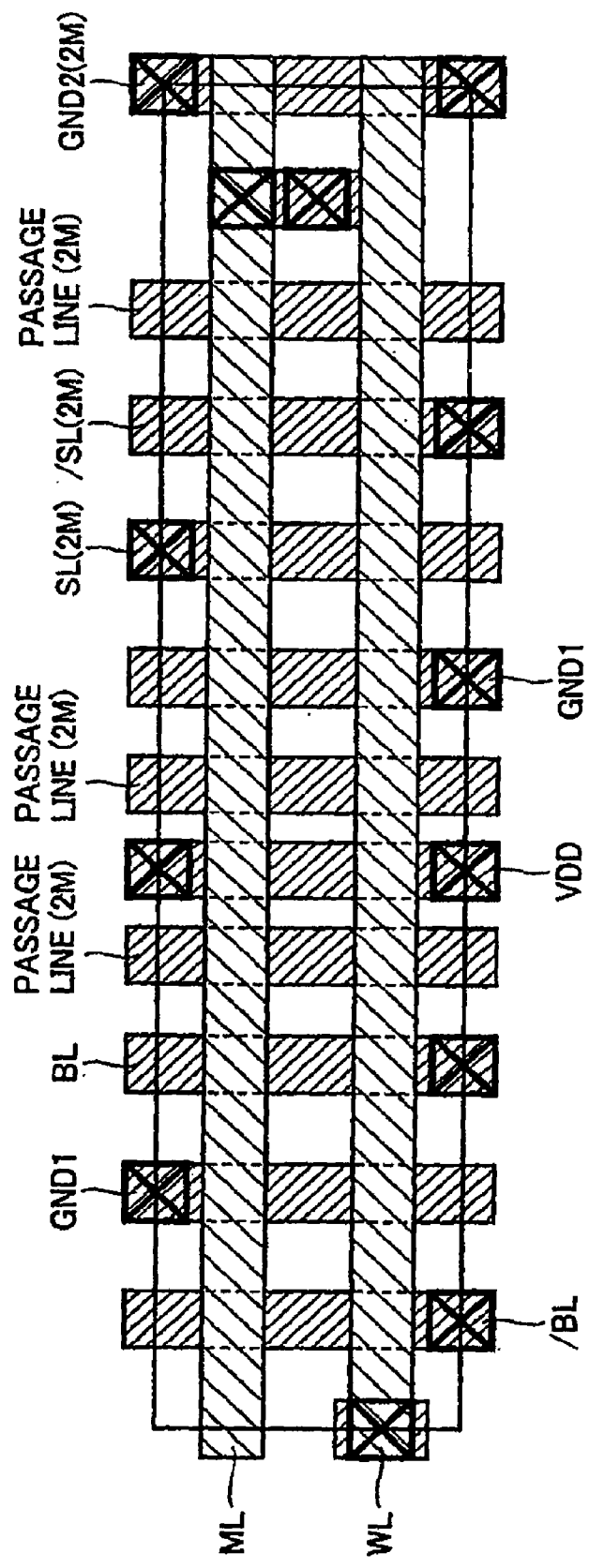
FIG. 20 is a schematic plan view showing the layout of the upper layer side in the stacking direction of the layout of FIG. 18.

Referring to FIGS. 18 to 20, the layout of the embodiment is different from that shown in FIGS. 14 to 16 mainly with respect to the point that nMOS transistor N8 is added.

nMOS transistor N8 is formed in p-type well PW1. nMOS transistor N8 has a source and a drain made by a pair of n-type diffusion regions FL206 and FL205, respectively, and gate PL4.

n-type diffusion regions FL205 in nMOS transistors N7 and N8 are formed by a common diffusion region, and gates PL4 are formed of a common doped polycrystalline silicon interconnection.

Different first metal interconnections are electrically connected to re-type diffusion regions FL204 and FL206 via a contact hole, and a second metal interconnection serving as ground line GND2 is electrically connected to each of the different first metal interconnections through a first via hole.

Since the other layout is substantially the same as that of FIGS. 14 to 16, the same reference numerals are designated to the same members, and their description will not be repeated.

In the embodiment, by adding nMOS transistor N8, match line ML can be set to the "L" level faster. Consequently, the retrieval operation can be performed at higher speed.

Since the other effects of the embodiment are substantially the same as those of the fourth embodiment, their description will not be repeated. Although transistors in the first to fifth embodiments have been described as MOS transistors, they may be MIS (Metal Insulator Semiconductors) transistors. The conductive types of p-type and n-type of each of the transistors may be opposite.

Although the first to fifth embodiments have been described with respect to the case where a bulk silicon substrate is used as a substrate in which an SRAM memory cell is formed, an SOI (Silicon On Insulator) substrate may be used as the substrate. A configuration in the case of using an SOI substrate will be described by taking the configuration of the first embodiment as an example.

Figure 21:
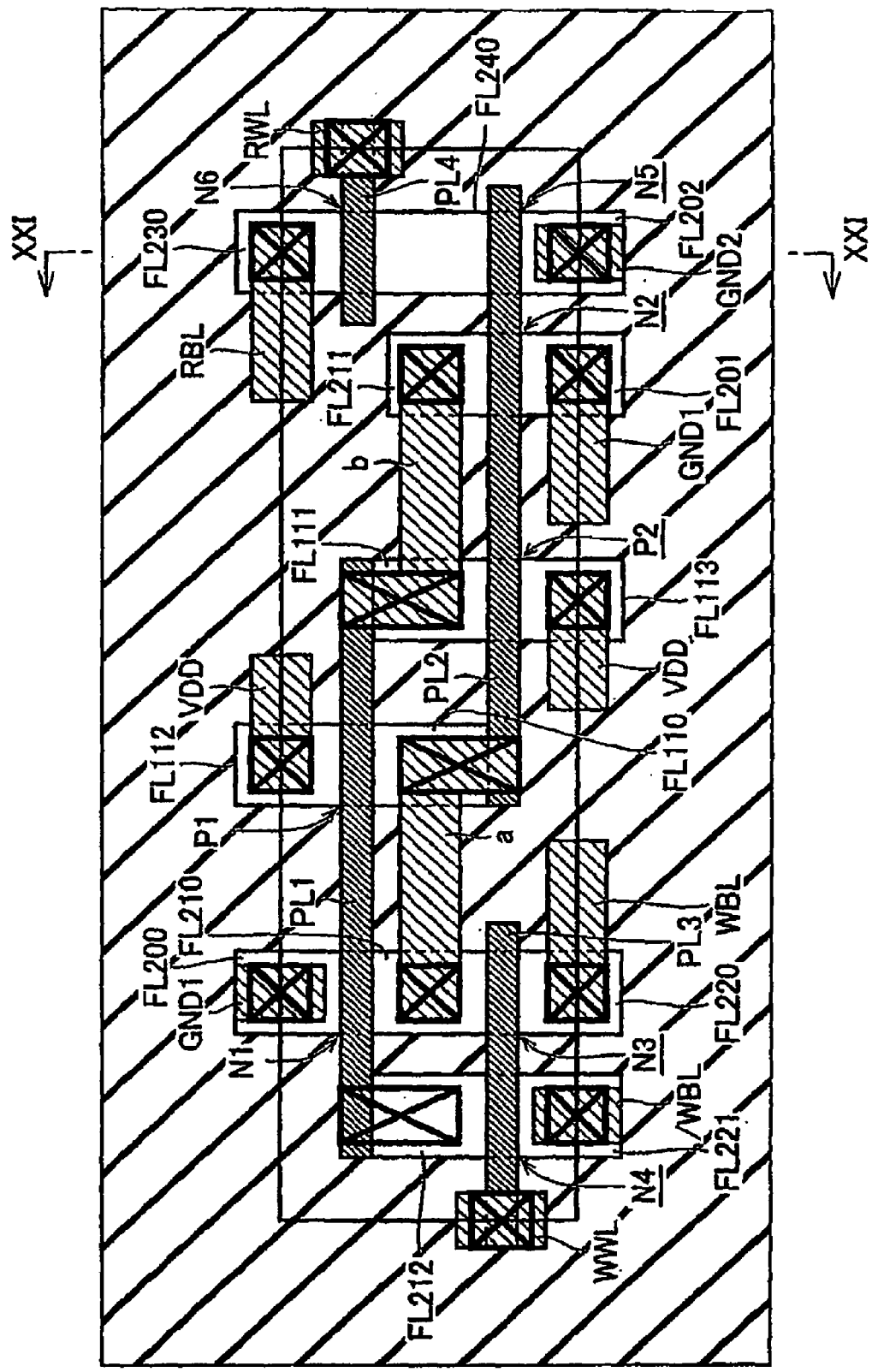
FIG. 21 is a schematic plan view showing the configuration in the case where the SOI structure is applied to a memory cell in the SRAM in the first embodiment of the present invention.
Figure 22:
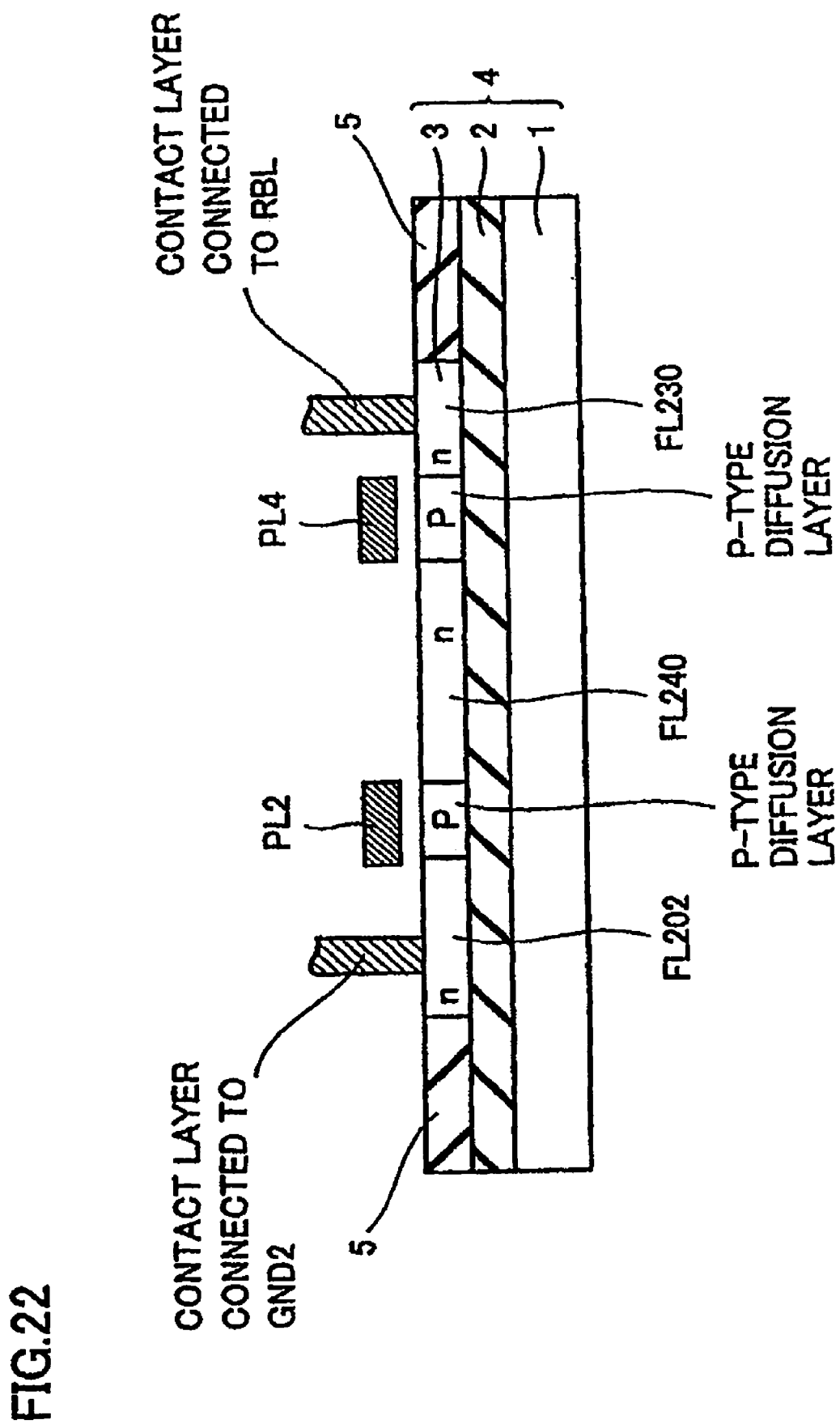
FIG. 22 is a schematic cross section taken along line XXI-XXI of FIG. 21.

Referring to FIGS. 21 and 22, an SOI substrate 4 has a configuration that a semiconductor substrate 1 made of, for example, silicon, an insulating film 2 taking the form of, for example, a buried oxide film, and a semiconductor layer 3 taking the form of, for example, a thin silicon layer are sequentially stacked. Consequently, wells PW0, PW1, and NW as shown in FIG. 3 do not exist. The region other than semiconductor layer 3 in buried oxide film 2 is covered with an oxide insulating film 5. Oxide insulating film 5 forms a device isolation region for electrically isolating a plurality of semiconductor layers 3.

Since the configuration other than the above-described configuration of the substrate is substantially the same as that of the first embodiment shown in FIGS. 1 to 4, the same reference numerals and characters are designated to the same members and their description will not be repeated.

For convenience of explanation, FIG. 21 shows the layout up to the first metal interconnection.

Although the case of applying the SOI substrate to the configuration of the first embodiment has been described above, the SOI substrate may be also applied to any of the configurations of the second to fifth embodiments.

As described above, in the semiconductor memory device according to one aspect of the present invention, since the gates of all of the transistors disposed in the memory cell region extend in the same direction, if the direction orthogonal to the gate extending direction is set as the direction in which the bit lines extend, the dimension in the bit line direction of the memory cell can be shortened. Thus, the wiring capacity of bit lines and capacity between the bit lines can be reduced, and the access time can be shortened.

Since the gates of all of the transistors disposed in the memory cell region extend in the same direction, optimization to finish the memory cell in a desired dimension is facilitated, and a margin of variations in manufacturing can be increased.

Further, the first and second access transistors are disposed on the opposite sides of the region in which the first and second load transistors are formed. Thus, the bit line for writing and the bit line for reading can be routed separately. Therefore, interference between ports can be suppressed.

In the aspect, preferably, a first transistor of the first conductive type having a gate electrically connected to the first storage node and a drain electrically connected to the source of the second access transistor is further provided. With the configuration, the potential of the bit line for reading can be adjusted in accordance with the potential of the first storage node.

In the aspect, preferably, first, second and third transistors are further provided. The gate of the first transistor of the first conductive type is electrically connected to the second storage node, and the drain is electrically connected to the source of the second access transistor. The gate of the second transistor of the first conductive type is electrically connected to a bit line for writing, and the drain is electrically connected to the second storage node. The gate of the third transistor of the first conductive type is electrically connected to a word line for writing, and a drain is electrically connected to the source of the second transistor. With the configuration, a writing characteristic can be improved with a single bit line type.

In the aspect, preferably, a fourth transistor of the first conductive type having a gate electrically connected to a column selection signal line, a drain electrically connected to the bit line for reading, and a source electrically connected to the drain of the second access transistor is further provided.

With the configuration, it becomes unnecessary to set the read bit line in a not-read column to the "L" level, so that power consumption can be reduced.

Preferably, in the aspect, a first region of the second conductive type disposed on one side of a first conductive type region and a second region of the second conductive type disposed on the other side are further provided. The first access transistor is disposed in the first region, the second access transistor is disposed in the second region, and the first and second load transistors are disposed in the first conductive type region. The bit lines for writing and reading extend in the direction parallel to a boundary line between the first conductive type region and the first region and a boundary line of the first conductive type region and the second region. With the configuration, the bit line length can be shortened.

In the aspect, preferably, a first ground line electrically connected to the source of either the first or second driver transistor, and a second ground line electrically connected to the source of the first transistor are separately routed. Consequently, noise prevention, reduction in leak current, higher processing speed, and the like can be achieved.

In the aspect, preferably, a passage line disposed in the same direction on the same layer as the bit lines for writing and reading and electrically disconnected from an element of the static memory cell is further provided. Since the passage line can be disposed in the memory cell, the cost can be lowered.

In a semiconductor memory device according to another aspect of the present invention, since the gates of all of the transistors disposed in the memory cell region extend in the same direction, if the direction orthogonal to the gate extending direction is set as the direction in which the bit lines extend, the dimension in the bit line direction of the memory cell can be shortened. Thus, the wiring capacity of bit lines and capacity between the bit lines can be reduced, and the access time can be shortened. Since the gates of all of the transistors disposed in the memory cell region extend in the same direction, optimization to finish the memory cell in a desired dimension is facilitated, and a margin of variations in manufacturing can be increased.

In the another aspect, preferably, a fourth transistor of the first conductive type having a gate electrically connected to the drains of the first and second transistors, and a drain electrically connected to a match line is further provided. With the configuration, the match line can be set to the "L" level at higher speed, so that the speed of the retrieval operation can be increased.

Preferably, in the another aspect, a first region of the second conductive type disposed on one side of a first conductive type region and a second region of the second conductive type disposed on the other side are further provided. The first and second access transistors and the first driver transistor are disposed in the first region, the second driver transistor and the first, second, and third transistors are disposed in the second region, and the first and second load transistors are disposed in the first conductive type region. The bit line pair and the sear line pair extend in the direction parallel to a boundary line between the first conductive type region and the first region and a boundary line of the first conductive type region and the second region. With the configuration, the bit line length can be shortened.

In the another aspect, preferably, a first ground line electrically connected to the source of either the first or second driver transistor, and a second ground line electrically connected to the source of the first transistor are separately routed. Consequently, noise prevention, reduction in leak current, higher processing speed, and the like can be achieved.

In the another aspect, preferably, a passage line disposed in the same direction on the same layer as the bit line pair and the search line pair and electrically disconnected from an element of the static memory cell is further provided. Since the passage line can be disposed in the memory cell, the cost can be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a semiconductor device including static type memory cells having first and second load transistors, first and second drive transistors, first and second access transistors, and first and second transistors, comprising:

forming first to fifth impurity regions of a first conductive type in a first well of a second conductive type;

forming sixth to tenth impurity regions of the first conductive type in a second well of the second conductive type;

forming eleventh to fourteenth impurity regions of the second conductive type in a third well of the first conductive type, wherein the third well is arranged between the first and second wells;

forming a first gate layer having a first portion arranged over a portion between the first and second impurity regions to provide the first drive transistor, and a second portion arranged over a portion between the eleventh and twelfth impurity regions to provide the first load transistor, wherein the first gate layer is shared for gate electrodes of the first drive transistor and the first load transistor;

forming a second gate layer having a third portion arranged over a portion between the sixth and seventh impurity regions to provide the second drive transistor, a fourth portion arranged over a portion between the thirteenth and fourteenth impurity regions to provide the second load transistor, and a fifth portion arranged over a portion between eighth and ninth impurity regions to provide the first transistor, wherein the second gate layer is shared for gate electrodes of the second drive transistor, the second load transistor, and the first transistor;

forming a third gate layer having a sixth portion arranged over a portion between the second and third impurity regions to provide the first access transistor, and a seventh portion arranged over a portion between fourth and fifth impurity regions to provide the second access transistor, wherein the third gate layer is shared for gate electrodes of the first and second access transistors;

forming a fourth gate layer having an eighth portion arranged over a portion between the ninth and tenth impurity regions to provide the second transistor, the fourth gate layer functioning as a gate electrode of the second transistor;

forming an electrical connection of the first gate layer to the fifth and thirteenth impurity regions;

forming an electrical connection of the second gate layer to the eleventh impurity region;

forming an electrical connection of the eleventh impurity region to the second impurity region to provide a first storage node of the static type memory cell;

forming an electrical connection of the thirteenth impurity region to the seventh impurity region to provide a second storage node of the static type memory cell;

forming a first word line electrically connected to the third gate layer;

forming a second word line electrically connected to the fourth gate electrode;

forming a first bit line electrically connected to the third impurity region;

forming a second bit line electrically connected to the fourth impurity region; and forming a third bit line electrically connected to the tenth impurity region.

2. The method of forming a semiconductor device according to claim 1, further comprising:

forming a first wiring for supplying a power supply voltage to the eleventh and fourteenth impurity regions;

forming a second wiring for supplying a ground voltage to the first impurity region;

forming a third wiring for supplying a ground voltage to the sixth impurity region; and forming a fourth wiring for supplying aground voltage to the eighth impurity region.

3. The method of forming a semiconductor device according to claim 2, wherein the first to fourth wirings and the first to third bit lines are arranged in parallel, and the first and second word lines are arranged in parallel to each other and perpendicularly to the first to third bit lines.

4. The method of forming a semiconductor device according to claim 3, wherein the first word line is arranged over the first to third wells, and the second word line is arranged over the first to third wells.

5. The method of forming a semiconductor device according to claim 1, wherein the second impurity region is shared for the first drive transistor and the first access transistor, and the ninth impurity region is shared for the first and second transistors.

\* \* \* \* \*